US007486088B2

(12) United States Patent
Komatsu et al.

(10) Patent No.: US 7,486,088 B2
(45) Date of Patent: Feb. 3, 2009

(54) METHOD FOR PREVENTING CORROSION OF CONTACT AND APPARATUS FOR PREVENTING CORROSION OF CONTACT

(75) Inventors: Kazuhiro Komatsu, Hyogo (JP); Tomohide Kasame, Hyogo (JP); Kouji Oonishi, Hyogo (JP)

(73) Assignee: Fujitsu Ten Limited, Kobe-Shi (JP)

( * ) Notice: Subject to any disclaimer, the term of this patent is extended or adjusted under 35 U.S.C. 154(b) by 99 days.

(21) Appl. No.: 11/391,637

(22) Filed: Mar. 29, 2006

(65) Prior Publication Data

US 2006/0279893 A1 Dec. 14, 2006

(30) Foreign Application Priority Data

Mar. 30, 2005 (JP) ........................... P2005-099748

(51) Int. Cl.
*G01R 27/08* (2006.01)
*G01R 31/02* (2006.01)

(52) U.S. Cl. ...................................... 324/700; 324/421

(58) Field of Classification Search ................. 324/421, 324/71.2, 700; 307/137
See application file for complete search history.

(56) References Cited

U.S. PATENT DOCUMENTS

| | | | | |
|---|---|---|---|---|
| 4,491,797 | A * | 1/1985 | Velsher | 324/421 |
| 4,873,603 | A * | 10/1989 | Ishii | 361/96 |
| 5,523,633 | A * | 6/1996 | Imaizumi et al. | 307/137 |
| 5,751,530 | A * | 5/1998 | Pelly et al. | 361/56 |
| 7,109,721 | B2 * | 9/2006 | Maurer et al. | 324/421 |
| 7,119,799 | B2 * | 10/2006 | Kaski | 345/173 |
| 2005/0231858 | A1 | 10/2005 | Komatsu et al. | |
| 2005/0231876 | A1 | 10/2005 | Komatsu et al. | |
| 2005/0231877 | A1 | 10/2005 | Komatsu et al. | |
| 2007/0120567 | A1 * | 5/2007 | Hagel et al. | 324/421 |

FOREIGN PATENT DOCUMENTS

| | | |
|---|---|---|
| JP | A 2002-343171 | 11/2002 |
| JP | A 2005-294198 | 10/2005 |
| JP | A 2005-294199 | 10/2005 |
| JP | A 2005-294200 | 10/2005 |

* cited by examiner

*Primary Examiner*—Diego Gutierrez
*Assistant Examiner*—Amy He
(74) *Attorney, Agent, or Firm*—Oliff & Berridge, PLC

(57) ABSTRACT

An apparatus for preventing corrosion of a contact includes a detection conducting path connected to the contact, a variable impedance unit and a comparing and switching unit. The variable impedance unit is connected to the detection conducting path. The variable impedance unit is switchable between (i) a first impedance used for passing a corrosion prevention current into the detection conducting path and (ii) a second impedance through used for passing a current, which is used for detecting a connection state of the contact, into the detection conducting path. The first impedance is lower than the second impedance. The comparing and switching unit compares a detected value with a corrosion threshold, compares the detected value with a restoration threshold and switches the variable impedance unit based on comparing results.

13 Claims, 22 Drawing Sheets

METHOD FOR PREVENTING CORROSION OF CONTACT AND APPARATUS FOR PREVENTING CORROSION OF CONTACT

CROSS-REFERENCE OF RELATED APPLICATIONS

This application is based upon and claims the benefit of priority from Japanese Patent Application No.2005-99748 filed on Mar. 30, 2005, the entire contents of which are incorporated herein by reference.

BACKGROUND OF THE INVENTION

1. Field of the Invention

The present invention relates to a corrosion preventing method in which a corrosion prevention current for removing corrosion of a contact is passed to remove corrosion of a contact, thereby preventing corrosion of the contact, and an apparatus for the method.

In the specification, "corrosion prevention current" is synonymous with a current for removing corrosion of a contact.

2. Description of the Related Art

In an apparatus which can detect a connection state of a contact of a switch, an erroneous determination and malfunction due to an increase of the resistance of the switch which is caused by corrosion of the contact become problematic. Recently, a corrosion preventing apparatus for removing corrosion of a contact has been put into practical use.

FIG. 29 is a circuit diagram schematically showing a contact corrosion preventing apparatus 1 which is disclosed in US 2005/0231858A. In the contact corrosion preventing apparatus 1, a comparator 6 compares the potential of a detection conducting path 5 which electrically connects a contact 3 of a grounded switch 2 to an electronic control section 4, with a predetermined potential VX. When the comparator 6 detects that the potential of the detection conducting path 5 is higher than the predetermined potential VX, the comparator detects corrosion of the contact 3. When corrosion of the contact 3 is detected, the output of the comparator 6 is set to Lo. A switching element 9 which is electrically connected to the detection conducting path 5 in parallel with a resistor 7, and which is electrically connected to a power source 8 is switched to a conduction state in which the terminals are conducting, thereby pausing a corrosion prevention current for removing corrosion through the contact 3.

FIG. 30 is a graph showing variation of the potential of the detection conducting path 5 with respect to an elapsed time. FIG. 31 is a graph showing output variation of the comparator 6 with respect to an elapsed time. In FIG. 30, the ordinate indicates the potential, and the abscissa indicates the time, and, in FIG. 31, the ordinate indicates Hi and Lo of the output of the comparator 6, and the abscissa indicates the time. In the contact corrosion preventing apparatus 1, when corrosion of the contact 3 proceeds, the potential of the detection conducting path 5 is raised. When the potential of the detection conducting path 5 becomes higher than the predetermined potential VX, the output of the comparator 6 is set to Lo to switch the switching element 9 to the conduction state, so that the corrosion prevention current is passed through the detection conducting path 5 and corrosion of the contact 3 is removed. When corrosion of the contact 3 is removed, the potential of the detection conducting path 5 is lowered. When the potential of the detection conducting path 5 becomes lower than the predetermined potential VX, the output of the comparator 6 is set to Hi to make the switching element 9 to a non-conduction state in which the terminals are not conducting, whereby a connection detection current which is used for detecting the connection state of the contact via the resistor 7, and which is smaller than the corrosion prevention current is passed through the detection conducting path 5 (see US 2005/0231858A).

SUMMARY OF THE INVENTION

In order to prevent an erroneous determination and a malfunction from occurring in an apparatus in which the contact corrosion preventing apparatus 1 is disposed (hereinafter, referred to merely as "apparatus"), the contact corrosion preventing apparatus 1 of US 2005/0231858A removes corrosion of the contact 3, i.e., reduces the resistance of the contact. When corrosion of the contact 3 is detected, the comparator 6 causes the corrosion prevention current to pass through the detection conducting path until the potential of the detection conducting path 5 becomes lower than the predetermined potential VX, thereby removing corrosion of the contact 3. In other words, the removal of corrosion of the contact 3 is continued until a resistance at which the potential of the detection conducting path 5 is lower than the predetermined potential VX (hereinafter, referred to "predetermined resistance") is attained. Even in a state where the resistance of the contact 3 is higher than the predetermined resistance, corrosion is removed to a degree at which an erroneous determination and malfunction of the apparatus can be prevented from occurring. In the contact corrosion preventing apparatus 1, namely, the corrosion prevention current is excessively passed to remove corrosion of the contact 3, thereby reducing the resistance of the contact 3. The passing of the corrosion prevention current causes the possibility that the apparatus performs an erroneous determination and a malfunction, and hence it is preferable to shorten the current passing time period. When the corrosion prevention current is excessively passed in this way, the lifetime of the contact corrosion preventing apparatus is shortened.

The invention provides a method for suppressing excessive corrosion prevention current from flowing for a long time and an apparatus therefor.

According to an aspect of the invention, a method for preventing corrosion of a contact, includes: comparing a detected value with a corrosion threshold to detect if the contact is corroded; comparing the detected value with a restoration threshold to determine if the contact is restored; when it is detected that the contact is corroded, passing a corrosion prevention current into a detection conducting path electrically connected to the contact; and when it is detected that the contact is restored, passing into the detection conducting path a current used for detecting a connection state of the contact.

According to this configuration, the detected value is compared with the corrosion threshold and with the restoration threshold to detect the corrosion of the contact and the restoration of the contact. When it is detected that the contact is corroded, a corrosion prevention current is passed into a detection conducting path electrically connected to the contact. When it is detected that the contact is restored, a current used for detecting a connection state of the contact is passed into the detection conducting path. According to the configuration, corrosion and restoration of the contact can be separately detected. The corrosion prevention current can be suppressed from excessively passing through the contact which is restored to a state where the connection state of the contact can be detected. Therefore, occurrences of a malfunction and an erroneous determination of the connection state of the contact can be suppressed. Furthermore, since excessive passing of the corrosion prevention current can be suppressed, the lifetime can be prolonged more than the contact corrosion preventing apparatus of US 2005/0231858A.

According to another aspect of the invention, an apparatus for preventing corrosion of a contact includes a detection conducting path connected to the contact, a variable impedance unit and a comparing and switching unit. The variable impedance unit is connected to the detection conducting path. The variable impedance unit is switchable between (i) a first impedance used for passing a corrosion prevention current into the detection conducting path and (ii) a second impedance through used for passing a current, which is used for detecting a connection state of the contact, into the detection conducting path. The first impedance is lower than the second impedance. The comparing and switching unit compares a detected value with a corrosion threshold, compares the detected value with a restoration threshold and switches the variable impedance unit based on comparing results.

According to this configuration, when the variable impedance unit is switched to the first impedance, the corrosion prevention current is passed into the detection conducting path. If the variable impedance unit is switched to the second impedance, the current used for detecting the connection state of the contact is passed into the detection conducting circuit. The comparing and switching unit compares the detected value with the corrosion threshold and with the restoration threshold, and switches the variable impedance unit based on the comparing results. According to the configuration, corrosion and restoration of the contact can be separately detected. The corrosion prevention current can be suppressed from excessively passing through a contact which is restored to a state where the connection state of the contact can be detected. Therefore, occurrences of an erroneous determination of the connection state of the contact and a malfunction of an apparatus in which the contact corrosion preventing apparatus is disposed (hereinafter, referred to merely as "apparatus") can be suppressed. Furthermore, since excessive passing of the corrosion prevention current can be suppressed, the lifetime can be prolonged more than a contact corrosion preventing apparatus of the conventional art.

The variable impedance unit may include an impedance unit and a switching element. The impedance unit has a third impedance. The impedance unit is connected to the detection conducting path. The switching element is connected to the detection conducting path in parallel to the impedance unit. The switching element is switchable between (i) a conduction state where terminals of the switching element is conducting and (ii) a non-conduction state where the terminals of the switching element is not conducting. The switching element has a fourth impedance. The third impedance is larger than the fourth impedance.

According to this configuration, the impedance unit and the switching element are connected to the detection conducting path in parallel to each other. The variable impedance unit is switched to the first impedance by switching the switching element is switched to the conducting state, and is switched to the second impedance by switching the switching element to the non-conducting state. Thereby, the variable impedance unit being switchable between the first impedance and the second impedance can be implemented.

Also, the detection value may be a potential of the detection conducting path. The corrosion threshold may be a corrosion potential. The restoration threshold may be a restoration potential. The comparing and switching unit may compare the potential of the detection conducting path with the corrosion potential, compare the potential of the detection conducting path with the restoration potential and switch the variable impedance unit based on the comparing results.

According to this configuration, the corrosion threshold is the corrosion potential, which is compared with the potential of the detection conducting path, that is, the detected value, to determine if the contact is corroded. The restoration threshold is the restoration potential, which is compared with the potential of the detection conducting path, that is, the detected value, to determine if the contact is restored. Accordingly, whether the contact is corroded and whether the contact is restored can be determined by comparing the potential of the detection conducting path with the corrosion potential and with the restoration potential.

Also, the detected value may include a potential of the detect conducting path and an amount of the current flowing through the detection conducting path. The corrosion threshold may be a corrosion potential. The restoration threshold may be a restoration current amount. The comparing and switching unit may compare the potential of the detection conducting path with the corrosion potential, compare the amount of the current flowing through the detection conducting path with the restoration current amount and switch the variable impedance unit based on the comparing results.

According to this configuration, the corrosion threshold is the corrosion potential, which is compared with the potential of the detection conducting path included in the detected value, to determine if the contact is corroded. The restoration threshold is the restoration current amount, which is compared with the amount of the current flowing through the detection conducting path included in the detected value, to determine if the contact is restored. Thereby, whether the contact is corroded and whether the contact is restored can be determined by comparing the potential of the detection conducting path and the amount of the current flowing through the detection conducting path with the corrosion potential and the restoration current amount, respectively.

Also, the comparing and switching unit may have a function of varying the restoration potential based on the potential of the detection conducting path.

According to this configuration, the comparing and switching unit varies the restoration potential based on the potential of the detection conducting path. According to the configuration, as compared with the case where the restoration potential is uniformly determined, the excessive corrosion prevention current passing through the detection conducting path can be suppressed. Therefore, an erroneous determination of the connection state of the contact and a malfunction of the apparatus can be further suppressed. Furthermore, since excessive passing of the corrosion prevention current can be suppressed, the lifetime of the contact corrosion preventing apparatus can be prolonged.

Also, the apparatus may further include a pause unit that pauses passing the corrosion prevention current for a predetermined pause time period if at least one of (i) a condition that a time period during which the corrosion prevention current flows into the detection conducting path is equal to or longer than a predetermined time period and (ii) a condition that an amount of the corrosion prevention current flowing into the detection conducting path is equal to or larger than a predetermined current amount, is satisfied.

According to this configuration, the pause unit pauses passing the corrosion prevention current for a predetermined pause time period if at least one of (i) the condition that the time period during which the corrosion prevention current flows into the detection conducting path is equal to or longer than the predetermined time period and (ii) the condition that the amount of the corrosion prevention current flowing into the detection conducting path is equal to or larger than the predetermined current amount, is satisfied. Therefore, the passing of the corrosion prevention current is paused for the pause time period, whereby the corrosion prevention current can be suppressed from continuously flowing for a long term. Namely, excessive passing of the corrosion prevention current can be suppressed. Consequently, occurrences of an erroneous determination of the connection state of the contact and a malfunction of the apparatus can be further suppressed. Furthermore, since excessive passing of the corrosion prevention current can be suppressed, the lifetime can be further prolonged.

Also, the apparatus may further include a counting unit and the stop unit. The counting unit counts at least one of (i) number of current-passing operations for passing the corrosion prevention current into the detection conducting path and (ii) number of pause operations in which the pause unit pauses passing the corrosion prevention current for the predetermined pause time period. The stop unit stops passing the corrosion prevention current when a counting result obtained by the counting unit is equal to or larger than a predetermined number.

According to this configuration, the counting unit counts at least one of (i) the number of the current-passing operations for passing the corrosion prevention current into the detection conducting path and (ii) the number of the pause operations in which the pause unit pauses passing the corrosion prevention current for the predetermined pause time period. The stop unit stops passing the corrosion prevention current when the counting result obtained by the counting unit is equal to or larger than the predetermined number. According to the configuration, the corrosion prevention current can be suppressed from accumulating in the detection conducting path and excessively passing by repetition of the current-passing operation and the pause operation. Consequently, occurrences of an erroneous determination of the connection state of the contact and a malfunction of the apparatus can be further suppressed. Furthermore, since excessive passing of the corrosion prevention current can be suppressed, the lifetime of the contact corrosion preventing apparatus can be further prolonged.

In the case of an erroneous determination of corrosion of a contact due to a failure of the contact or the like, in the contact corrosion preventing apparatus of US 2005/0231858A, a corrosion prevention current continues to be excessively passed. In conjunction with a failure of the contact or the like, therefore, the contact corrosion preventing apparatus of the conventional art breaks down. In the contact corrosion preventing apparatus of the embodiment, when the number of current-passing operations becomes equal to or larger than the stop number, passing of the corrosion prevention current is stopped, and the contact corrosion preventing apparatus can be prevented from breaking down in conjunction with a failure of the contact or the like.

Also, the apparatus may further include an impedance lowering unit that lowers an input impedance of the contact when the pause unit pauses passing the corrosion prevention current.

According to this configuration, the impedance lowering unit lowers an input impedance of the contact when the pause unit pauses passing the corrosion prevention current. Even when the stop operation is performed, therefore, noises can be suppressed from being generated in the detection conducting path.

Also, the apparatus may further include an impedance lowering unit that lowers an input impedance of the contact at least one of (i) when the pause unit pauses passing the corrosion prevention current and (ii) when the stop unit stops passing the corrosion prevention current.

According to this configuration, if at least one of the pause operation and the stop operation is performed, the impedance lowering unit lowers the input impedance of the contact. Even when the pause operation is performed, therefore, noises can be suppressed from being generated in the detection conducting path.

Also, the contact may include a contact of a switch. The impedance unit may include a resistor. The switching element may include a field effect transistor. The comparing and switching unit may include a comparator having a hysteresis.

According to this configuration, the contact includes the contact of the switch. The impedance unit includes the resistor. The switching element includes the field effect transistor. The comparing and switching unit includes the comparator having the hysteresis. Using this configuration makes it possible to realize the apparatus for preventing corrosion of the contact.

According to a still another aspect of the invention, an apparatus for preventing corrosion of a contact, includes a detection conducting path connected to the contact, a variable impedance unit, a comparing and switching unit and a pause unit. The variable impedance unit is connected to the detection conducting path. The variable impedance unit is switchable between (i) a first impedance used for passing a corrosion prevention current into the detection conducting path and (ii) a second impedance through used for passing a current, which is used for detecting a connection state of the contact, into the detection conducting path. The first impedance is lower than the second impedance. The comparing and switching unit compares a detected value with a corrosion/restoration threshold and switches the variable impedance unit based on a comparing result. The pause unit pauses passing the corrosion prevention current for a predetermined pause time period if at least one of (i) a condition that a time period during which the corrosion prevention current flows into the detection conducting path is equal to or longer than a predetermined time period and (ii) a condition that an amount of the corrosion prevention current flowing into the detection conducting path is equal to or larger than a predetermined current amount, is satisfied.

According to this configuration, when the variable impedance unit is switched to the first impedance, the corrosion prevention current is passed into the detection conducting path. If the variable impedance unit is switched to the second impedance, the current used for detecting the connection state of the contact is passed into the detection conducting circuit. The comparing and switching unit compares the detected value with the corrosion threshold and with the restoration threshold, and switches the variable impedance unit based n the comparing results. The pause unit pauses passing the corrosion prevention current for a predetermined pause time period if at least one of (i) a condition that a time period during which the corrosion prevention current flows into the detection conducting path is equal to or longer than a predetermined time period and (ii) a condition that an amount of the corrosion prevention current flowing into the detection conducting path is equal to or larger than a predetermined current amount, is satisfied. Therefore, the corrosion prevention current can be suppressed from continuously flowing for a long term, by pausing the passing of the corrosion prevention current for the pause time period. Namely, excessive passing of the corrosion prevention current can be suppressed. Consequently, occurrences of an erroneous determination of the connection state of the contact and a malfunction of the apparatus can be suppressed. Furthermore, since excessive passing of the corrosion prevention current can be suppressed, the lifetime of the contact corrosion preventing apparatus can be prolonged.

DETAILED DESCRIPTION OF EMBODIMENTS OF THE INVENTION

Figure 1:
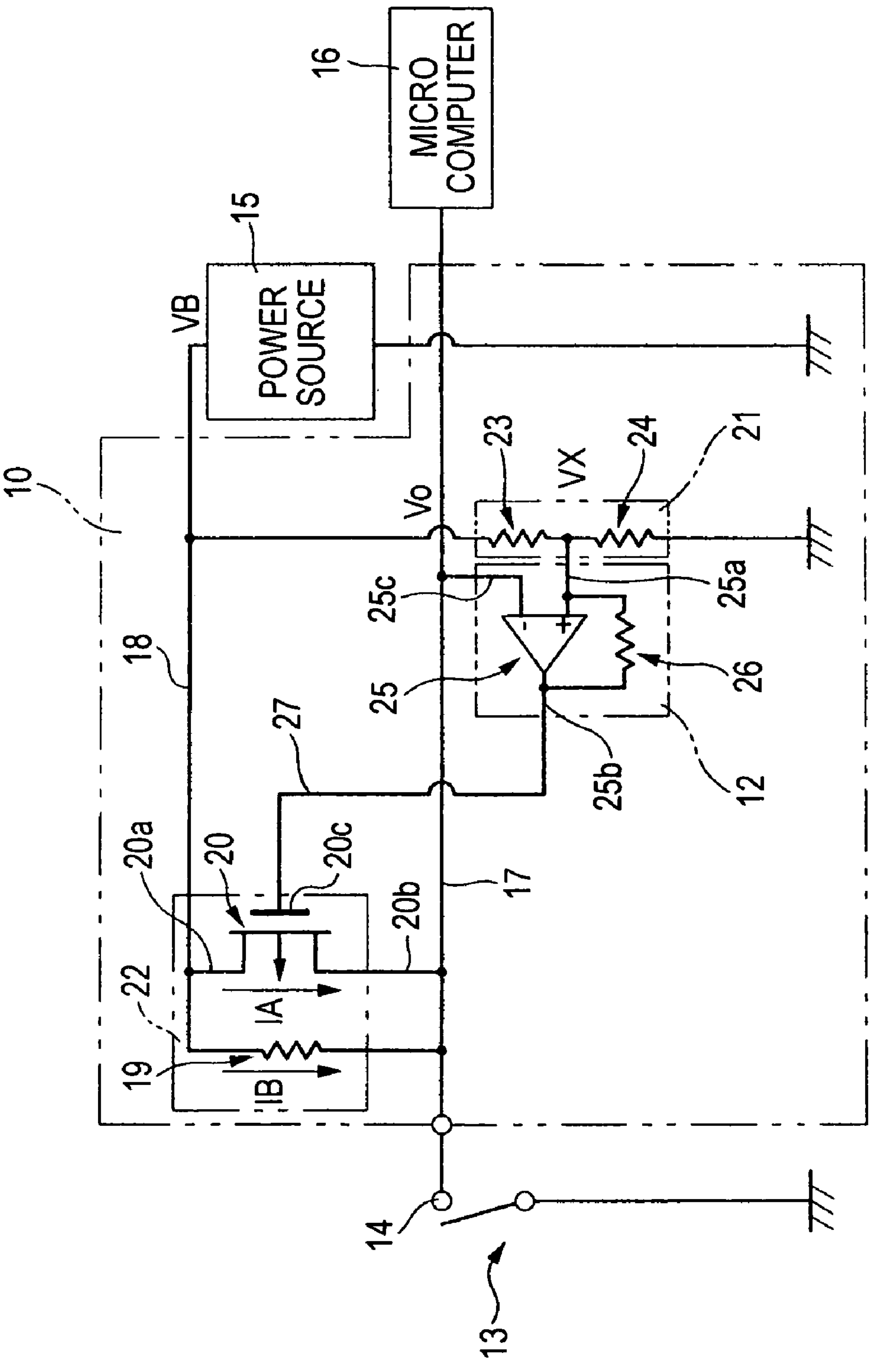
FIG. 1 is a circuit diagram schematically showing a contact corrosion preventing apparatus 10 of a first embodiment.

Hereinafter, plural embodiments in which the invention is implemented will be described with reference to the drawings. Portions corresponding to items which are described in an embodiment(s) preceding the respective embodiments are denoted by the same reference numerals, and duplicated descriptions are often omitted. In the case where only a part of the configuration is described, the other part of the configuration is identical with an embodiment(s) which is precedently described. Not only combinations of portions which are specifically described in respective embodiments, but also partial combinations of embodiments are enabled unless the combinations do not cause a trouble.

Figure 2:
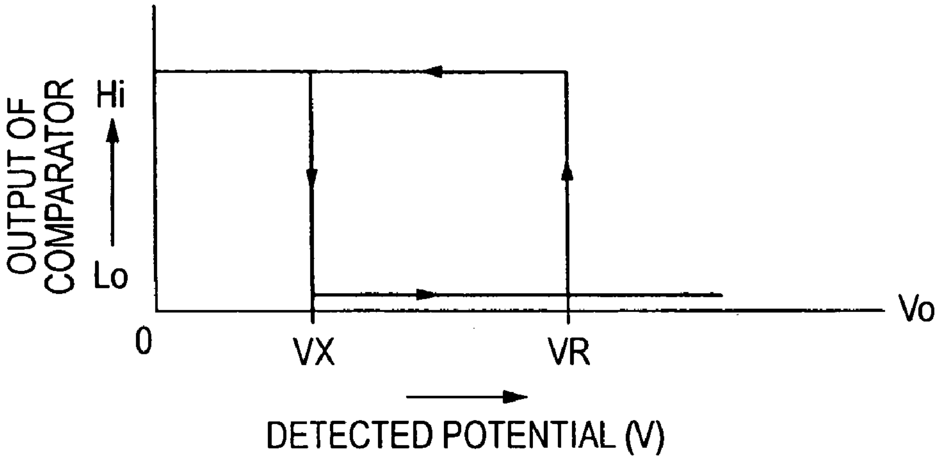
FIG. 2 is a graph showing the output characteristic of a comparing and switching unit 12.

FIG. 1 is a circuit diagram schematically showing a contact corrosion preventing apparatus 10 of a first embodiment. FIG. 2 is a graph showing the output characteristic of a comparing and switching unit 12. In FIG. 2, the ordinate indicates the level of an output signal of the comparing and switching unit, and the abscissa indicates the potential. The contact corrosion preventing apparatus 10 is disposed in an apparatus which detects a connection state of a contact 14 included in a switch 13 or a connector. The contact corrosion preventing apparatus 10 detects corrosion and restoration of the contact 14. When corrosion of the contact 14 is detected, the contact corrosion preventing apparatus 10 passes a corrosion prevention current IA for removing corrosion of the contact 14, and, when restoration of the corroded contact 14 is detected, stops passing of the corrosion prevention current IA. The contact corrosion preventing apparatus 10 is an apparatus for removing corrosion of the contact 14, and reducing the resistance of the contact 14. The contact corrosion preventing apparatus 10 is included in an electronic apparatus including the switch 13 or a connector, for example, an Electronic Control Unit (abbreviated to ECU). The contact corrosion preventing apparatus 10 is electrically connected to the switch 13, a power source 15, and a microcomputer 16.

The switch 13 is configured so that, when the switch 13 is turned ON, the electrical connection state between two terminals including the contact 14 (hereinafter, referred to merely as "connection state of the contact 14") can be switched to a closed state, and, when the switch 13 is turned OFF, the connection state of the contact 14 can be switched to an opened state. In the switch 13, the contact 14 is electrically connected to the contact corrosion preventing apparatus 10, and the terminal other than the contact 14 is grounded. When the switch 13 is switched to ON, the two terminals are electrically connected to each other so that the contact 14 is grounded. When the switch 13 is switched to OFF, the two terminals are electrically separated from each other.

The power source 15 has a function of supplying a power source voltage VB which is a constant voltage for causing the microcomputer 16 to logically determine the connection state of the contact 14, to the contact corrosion preventing apparatus 10. The power source 15 is a constant voltage power source which supplies the constant voltage from the outside of the contact corrosion preventing apparatus 10 to the contact corrosion preventing apparatus 10. In the power source 15, the low-potential side is grounded, and the high-potential side is connected to the contact corrosion preventing apparatus 10. For example, the power source 15 is 14 V. The microcomputer 16 has a function of logically determining the connection state of the switch 13.

The contact corrosion preventing apparatus 10 includes a detection conducting path 17, a power-source conducting path 18, a resistor 19, a switching element 20, a reference voltage source 21, and a comparing and switching unit 12. The detection conducting path 17 is made of a conductive material, one end of the path is electrically connected to the contact 14 of the switch 13, and the other end is electrically connected to the microcomputer 16. The power-source conducting path 18 is made of a conductive material, and the power source 15 is connected to one end of the path. In the resistor 19 which is impedance means, one end is electrically connected between the contact 14 of the detection conducting path 17 and the microcomputer 16, and the other end is electrically connected to the other end of the power-source conducting path 18. The resistor 19 is configured so as to pass a connection detection current IB for allowing the microcomputer 16 to logically determine the connection state of the contact 14, into the detection conducting path 17 by the power source voltage VB of the power source 15. For example, the connection detection current IB is 1 mA.

The switching element 20 has an impedance which is lower than the resistor 19, and includes two terminals which are electrically connected to the power-source conducting path 18 and the detection conducting path 17, respectively. The switching element 20 has a function of switching between a conduction state in which the terminals are conducting, and a non-conduction state in which the terminals are not conducting. Specifically, the switching element 20 is configured by a p-channel MOSFET transistor. In the switching element 20, in parallel with the resistor 19, the drain **20*a* which is one terminal is electrically connected to the power-source conducting path 18, and the source 20*b* which is the other terminal is electrically connected to the detection conducting path 17. The switching element 20 has a function of, in a conduction state in which the drain 20*a* and the source 20*b* are conducting, passing the corrosion prevention current IA for removing corrosion of the contact 14 to the detection conducting path 17, by the power source voltage VB of the power source 15**. The corrosion prevention current IA is larger than the connection detection current IB, and, for example, 20 mA.

In the embodiment, a combination of the resistor 19 and the switching element 20 is generally called variable impedance means 22. When the switching element 20 is set to the non-conduction state, the variable impedance means 22 has a high impedance, and passes the connection detection current IB to the detection conducting path 17 via the resistor 19. When the switching element 20 is set to the conduction state, the variable impedance means 22 has a low impedance, and passes the corrosion prevention current to the detection conducting path 17 via the switching element 20.

The reference voltage source 21 is a voltage-dividing resistance circuit configured by electrically connecting in series a first voltage dividing resistor 23 and a second voltage dividing resistor 24 with each other. The reference voltage source 21 is not restricted to a voltage-dividing resistance circuit, and may be a voltage dividing circuit as far as it has a configuration which can supply a reference voltage. In the reference voltage source 21, one end on the side of the first voltage dividing resistor 23 is electrically connected to a point of the power-source conducting path 18 which is on the side of the power source 15 with respect to the switching element 20, and the other end on the side of the second voltage dividing resistor 24 is grounded.

The comparing and switching unit 12 which is comparing and switching means is a so-called hysteresis comparator, and includes a comparator 25 and a hysteresis resistor 26. The comparing and switching unit 12 is configured by electrically connecting the one and other ends of the hysteresis resistor 26 to the non-inverting input terminal **25*a* and output terminal 25*b* of the comparator 25, respectively. In the comparing and switching unit 12, the inverting input terminal 25*c* is electrically connected to the detection conducting path 17, the non-inverting input terminal 25*a* is electrically connected between the first voltage dividing resistor 23 and the second voltage dividing resistor 24, and the output terminal 25*b* is electrically connected to the gate 20*c* of the switching element 20 via an output conducting path 27**.

The comparing and switching unit 12 has a function of comparing the potential of the detection conducting path 17 (hereinafter, referred to merely as "detection potential") with a corrosion potential VX and a restoration potential VR. As shown in FIG. 2, the comparing and switching unit 12 has a function of, when the detection potential is raised to become higher than the corrosion potential VX, switching the output signal from a high level (hereinafter, referred to merely as "Hi") to a low level (hereinafter, referred to merely as "Lo"), and, when the detection potential is lowered to become lower than the restoration potential VR, switching the output signal from Lo to Hi. The corrosion potential VX which is a corrosion threshold is a reference potential which is supplied from the reference voltage source 21 to the non-inverting input terminal **25*a*, and, for example, 1 V. The reference potential is obtained by dividing the power source voltage VB with the first voltage dividing resistor 23 and the second voltage dividing resistor 24. The restoration potential VR which is a restoration threshold is a potential which is defined by the hysteresis resistor 26**, and, for example, 4 V. The corrosion potential VX has a value which is smaller than the restoration potential VR.

The comparing and switching unit 12 has a function of switching the conduction state and non-conduction state of the switching element 20 in accordance with the output signal. Specifically, the comparing and switching unit 12 has a function of supplying the output signal of Hi to the switching element 20 to switch the switching element 20 to the non-conduction state, and supplying the output signal of Lo to the switching element 20 to switch the switching element 20 to the conduction state.

The microcomputer 16 has a function of logically determining the connection state of the contact 14 on the basis of the detection potential. In other words, the microcomputer 16 has a function of logically determining the connection state of the contact 14 on the basis of a signal input from the detection conducting path 17 (hereinafter, referred to merely as "input signal"). Specifically, the microcomputer 16 determines Lo and Hi of the input signal, and, in case of Lo, determines that the connection state of the contact 14 is a closed state, and, in case of Hi, determines that the connection state of the contact 14 is an opened state.

The corrosion potential VX is a potential at which corrosion of the contact 14 can be determined, and the restoration potential VR is a potential at which restoration of the contact 14 can be determined. Specifically, the corrosion potential VX is set to be equal to or lower than a potential VU at which there is the possibility that, when the connection detection current IB is passed through the detection conducting path 17, the microcomputer 16 erroneously determines the connection state of the contact 14 because of corrosion of the contact 14. The restoration potential VR is set to a potential to which the potential is once lowered when the corrosion prevention current IA is passed, and at which the microcomputer 16 surely determines the connection state of the contact 14 when the connection detection current IB is passed.

Figure 3:
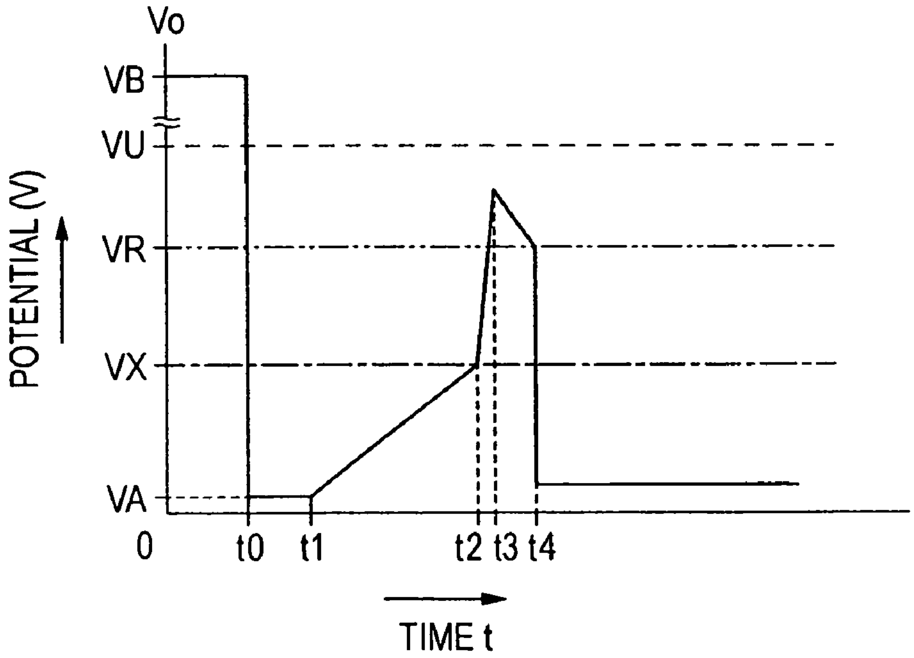
FIG. 3 is a graph showing variation of a detection potential V0 with respect to an elapsed time.
Figure 4:
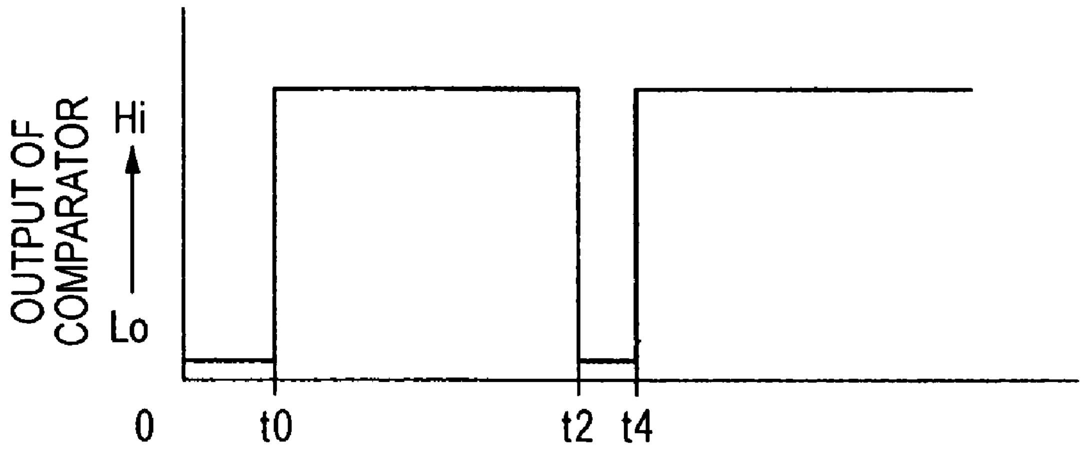
FIG. 4 is a graph showing output variation of the comparing and switching unit 12 with respect to an elapsed time.

FIG. 3 is a graph showing variation of a detection potential V0 with respect to an elapsed time. FIG. 4 is a graph showing output variation of the comparing and switching unit 12 with respect to an elapsed time. In FIG. 3, the ordinate indicates the potential, and the abscissa indicates the time. In FIG. 4, the ordinate indicates the level of the output signal, and the abscissa indicates the time. Hereinafter, the operation of the thus configured contact corrosion preventing apparatus 10 will be described. In the state where the switch 13 is OFF, the detection potential V0 which is the value to be detected becomes the power source voltage VB ($0 \leqq t < t0$). At this time, the detection potential V0 is higher than the corrosion potential VX, and hence the output signal is Lo. On the basis of the detection potential V0, the microcomputer 16 logically determines the connection state of the contact 14.

When the switch 13 is switched to ON (t=t0), the contact 14 is grounded, and the detection potential V0 becomes a potential VA ($t0 \leqq t < t1$). The detection potential V0 becomes lower than the restoration potential VR, and the output signal becomes Hi. When the output signal becomes Hi, the switching element 20 is set to the non-conduction state. This causes the connection detection current IB to be passed through the detection conducting path 17 via the resistor 19, and the microcomputer 16 logically determines the connection state of the contact 14 based on the detection potential V0.

When corrosion of the contact 14 is started (t=t1), the increase of the resistance of the contact 14 which is due to corrosion of the contact 14 occurs, and the detection potential V0 is raised ($t1 \leqq t < t2$). When the detection potential V0 is raised to become higher than the corrosion potential VX (t=t2), the output signal becomes Lo, and the switching element 20 is set to the conduction state. This causes the corrosion prevention current IA to be passed through the detection conducting path 17, and the detection potential V0 is raised ($t2 \leqq t < t3$). When the operation of removing corrosion of the contact 14 is started (t=t3), the detection potential V0 is lowered ($t3 \leqq t < t4$). When the detection potential V0 is lowered to become lower than the restoration potential VR (t=t4), the output signal becomes Hi, and the switching element 20 is set to the non-conduction state. This causes the connection detection current IB to be passed through the detection conducting path 17 via the resistor 19 ($t4 \leqq t$). As a result, the microcomputer 16 logically determines the connection state of the contact 14 based on the detection potential V0.

Hereinafter, effects achieved by the thus configured contact corrosion preventing apparatus 10 will be described. The contact corrosion preventing apparatus 10 of the embodiment compares the detection potential V0 with the corrosion potential VX and the restoration potential VR, and detects corrosion and restoration of the contact 14. When corrosion of the contact 14 is detected, the corrosion prevention current IA is passed through the detection conducting path 17. When restoration of the corroded contact 14 is detected, the connection detection current IB is passed through the detection conducting path 17. According to the configuration, corrosion and restoration of the contact 14 can be separately detected, and the corrosion prevention current IA can be suppressed from excessively passing through the contact 14 which is restored to a state where the connection state of the contact 14 can be logically determined. Therefore, occurrences of an erroneous determination of the connection state of the contact 14 and a malfunction of the apparatus can be suppressed. Furthermore, since excessive passing of the corrosion prevention current IA can be suppressed, the lifetime can be prolonged more than the contact corrosion preventing apparatus 10 of the conventional art, and also that the lifetime of the microcomputer 16 can be prolonged.

According to the contact corrosion preventing apparatus 10 of the embodiment, when the variable impedance means 22 is switched to a low impedance, the corrosion prevention current IA is passed through the detection conducting path 17, and, when the variable impedance means 22 is switched to a high impedance, the connection detection current IB is passed through the detection conducting path 17. The comparing and switching unit 12 compares the detection potential V0 with the corrosion potential VX and the restoration potential VR, and, based on a result of the comparison, switches the variable impedance means 22. According to the configuration, corrosion and restoration of the contact 14 can be separately detected, and the corrosion prevention current IA can be suppressed from excessively passing through the contact 14 which is restored to a state where the connection state of the contact 14 can be detected. Therefore, occurrences of an erroneous determination of the connection state of the contact 14 and a malfunction of the apparatus can be suppressed. Furthermore, since excessive passing of the corrosion prevention current IA can be suppressed, the lifetime can be prolonged more than the contact corrosion preventing apparatus 10 of the conventional art, and also the lifetime of the microcomputer 16 can be prolonged.

According to the contact corrosion preventing apparatus 10 of the embodiment, the resistor 19 and the switching element 20 are connected in parallel to the detection conducting path 17. By switching the switching element 20 to the conduction state, the variable impedance means 22 is switched to a low impedance, and, by switching the switching element 20 to the non-conduction state, the variable impedance means 22 is switched to a high impedance. According to the configuration, it is possible to realize the variable impedance means 22 which is switchable between the low impedance and the high impedance.

According to the contact corrosion preventing apparatus 10 of the embodiment, the corrosion potential VX can be used in determination of corrosion of the contact 14 with being compared with the detection potential V0. The restoration potential VR can be used in determination of restoration of the contact 14 with being compared with the detection potential V0. Therefore, determination of corrosion and restoration of the contact 14 can be realized by comparing the detection potential V0 with the corrosion potential VX and the restoration potential VR.

According to the contact corrosion preventing apparatus 10 of the embodiment, the potential is set to a potential to which the potential is once lowered when the corrosion prevention current IA is passed, and at which the microcomputer 16 can determine the connection state of the contact 14 when the connection detection current IB is passed. In the contact corrosion preventing apparatus 10, excessive passing of the corrosion prevention current IA is suppressed, and moreover the contact 14 can be restored to a state where the microcomputer 16 can surely logically determine the connection state of the contact 14. Therefore, an erroneous determination and malfunction of the microcomputer 16 can be suppressed.

According to the contact corrosion preventing apparatus 10 of the embodiment, the restoration potential VR can be changed simply by adjusting the resistance of the hysteresis resistor 26. The restoration potential VR is different depending on the material and state of the contact 14, and the environment in which the contact 14 is disposed. Therefore, an erroneous determination and malfunction of the contact corrosion preventing apparatus 10 can be further suppressed by changing the resistance in accordance with the material, state, and environment of the contact 14, and the like.

Figure 5:
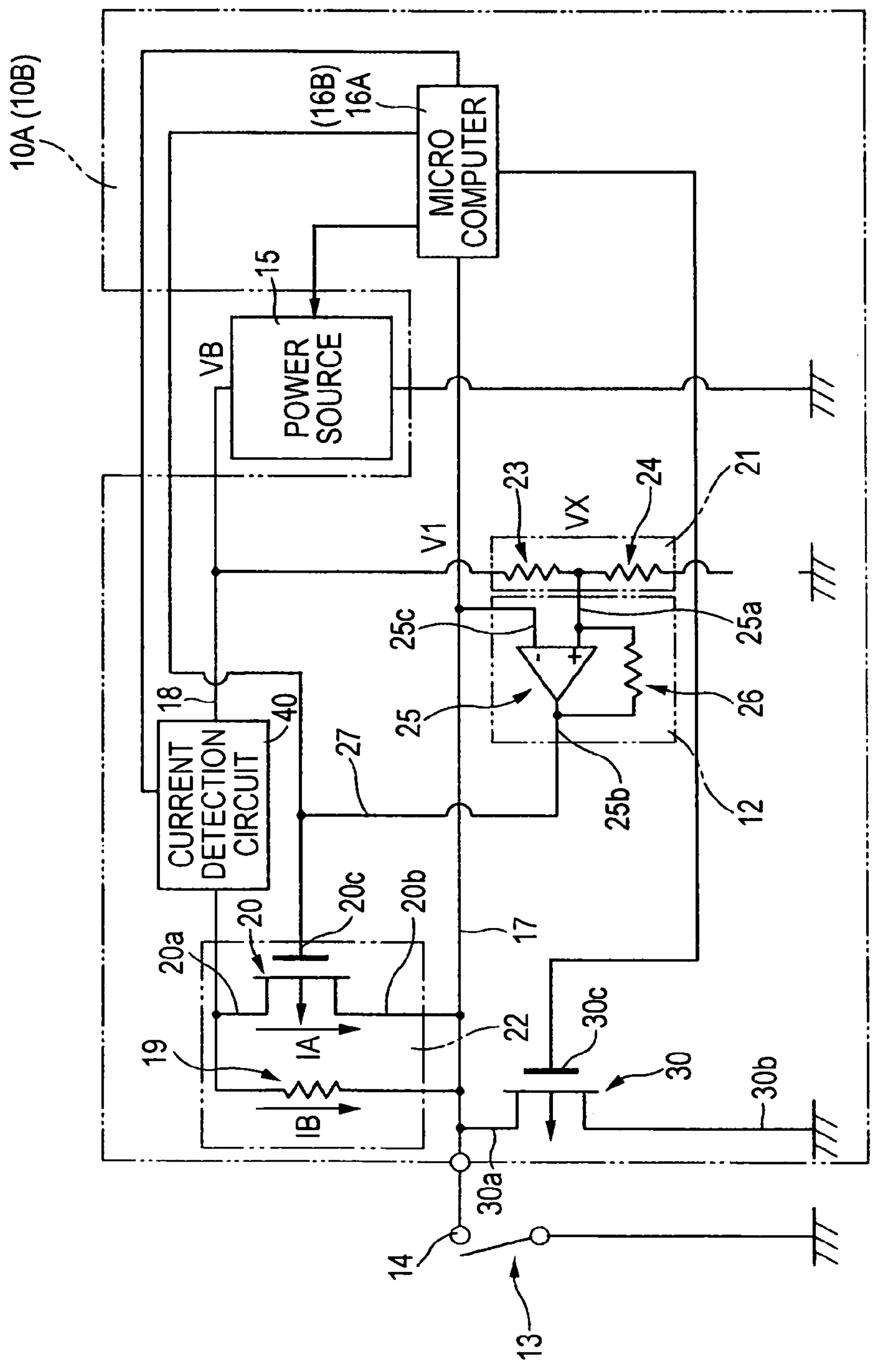
FIG. 5 is a circuit diagram schematically showing a contact corrosion preventing apparatus 10A of a second embodiment.

FIG. 5 is a circuit diagram schematically showing a contact corrosion preventing apparatus 10A of a second embodiment. The contact corrosion preventing apparatus 10A is similar in configuration to the contact corrosion preventing apparatus 10 of the first embodiment. The contact corrosion preventing apparatus 10A includes a current detection circuit 40 and a ground switching element 30 in addition to the contact corrosion preventing apparatus 10 of the first embodiment, and the microcomputer 16 is included in the contact corrosion preventing apparatus 10A.

In the power-source conducting path 18, the current detection circuit 40 is interposed between the switching element 20 and the power source 15. The current detection circuit 40 is electrically connected to the microcomputer 16. The current detection circuit 40 has a function of detecting whether a current is passed through the power-source conducting path 18 or not. The current detection circuit 40 has a function of transmitting whether a current is passed through the power-source conducting path 18 or not, to the microcomputer 16A.

The microcomputer 16A which is pausing means is further electrically connected to the power source 15, and electrically connected between the switching element 20 of the output conducting path 27 and the comparing and switching unit 12. The microcomputer 16A has the same function as the microcomputer 16 in the first embodiment. The microcomputer 16A has further functions of obtaining the output signal, and counting the time period when a current is passed through the power-source conducting path 18, and the output signal of Lo is output, i.e., the current passing time period when the corrosion prevention current IA continues to be passed. The microcomputer 16A has a function of, when the current passing time period becomes equal to or longer than a predetermined driving time period T1, pausing the voltage supply of the power source 15 for a pause time period T2 to pause the passing of the corrosion prevention current IA. In the embodiment, the driving time period T1 and the pause time period T2 are equal to each other, and, for example, 10 μsec. However, the driving time period T1 and the pause time period T2 are not restricted to be equal to each other, and may be different from each other.

The ground switching element 30 which is impedance lowering means is, for example, a p-channel MOSFET transistor. The drain 30*a* is electrically connected to a point of the detection conducting path 17 which is on the side of the contact 14 with respect to the resistor 19, the source 30*b* is grounded, and the gate 30*c* is electrically connected to the microcomputer 16A. The ground switching element 30 has a function of, based on an signal supplied to the gate 30*c*, switching the drain 30*a* and the source 30*b* to either of the conduction state and the non-conduction state. The ground switching element 30 is disposed in order that the input impedance of the contact 14 is reduced by setting the element to the conduction state. The microcomputer 16A has a function of, when the supply from the power source 15 is paused, supplying the signal to the gate 30*c* to switch the ground switching element 30 to the conduction state, and, when the power source 15 supplies the voltage, switching the ground switching element 30 to the non-conduction state.

Figure 6:
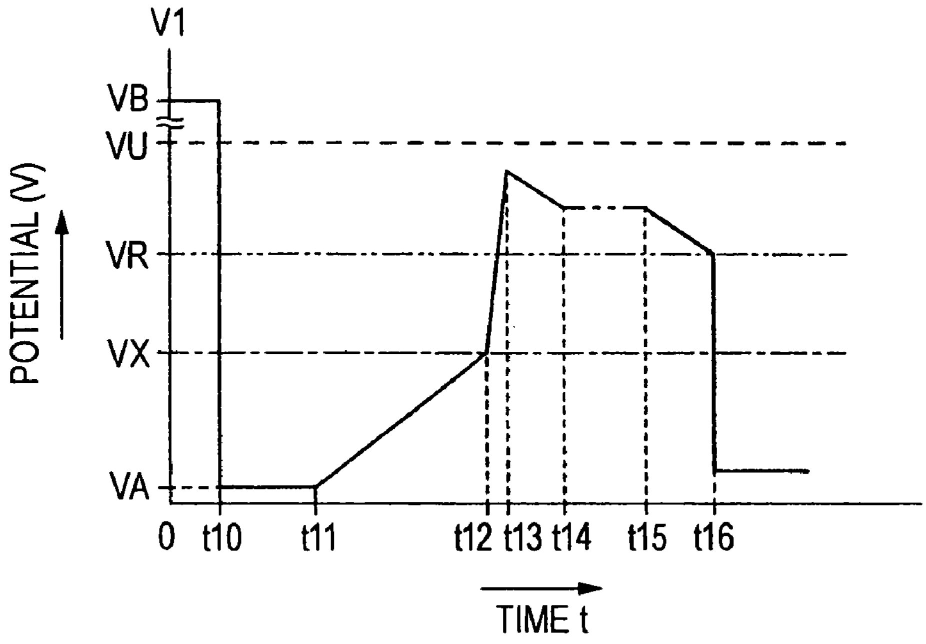
FIG. 6 is a graph showing variation of a detection potential V1 with respect to an elapsed time.
Figure 7:
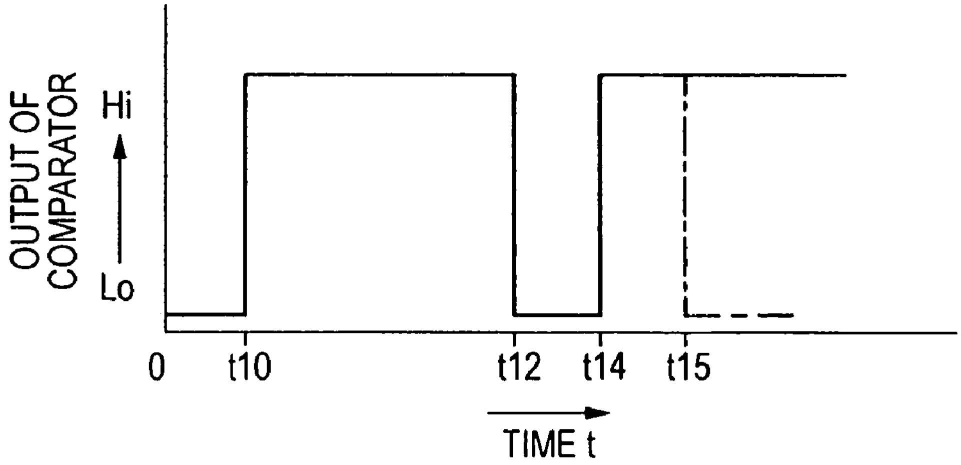
FIG. 7 is a graph showing output variation of the comparing and switching unit 12 with respect to an elapsed time.

FIG. 6 is a graph showing variation of a detection potential V1 with respect to an elapsed time. FIG. 7 is a graph showing output variation of the comparing and switching unit 12 with respect to an elapsed time. In FIG. 6, the ordinate indicates the potential, and the abscissa indicates the time. In FIG. 7, the ordinate indicates the level of the output signal, and the abscissa indicates the time. Hereinafter, the operation of the thus configured contact corrosion preventing apparatus 10A will be described. In the state where the switch 13 is OFF, the detection potential V1 becomes the power source voltage VB (0≦t<t10). The detection potential V1 is higher than the corrosion potential VX, and hence the output signal becomes Lo. The current detection circuit 40 transmits to the microcomputer 16A that a current is not passed through the power-source conducting path 18. On the basis of the detection potential V1, the microcomputer 16A logically determines the connection state of the contact 14. When the switch 13 is switched to ON (t=t10), the contact 14 is grounded, and the detection potential V1 becomes the potential VA (t10≦t<t11). The current detection circuit 40 transmits to the microcomputer 16A that a current is passed through the power-source conducting path 18. The detection potential V1 becomes lower than the restoration potential VR, and the output signal becomes Hi. When the output signal becomes Hi, the switching element 20 is set to the non-conduction state, and the connection detection current IB is passed through the detection conducting path 17 via the resistor 19. Therefore, the microcomputer 16A logically determines the connection state of the contact 14 based on the detection potential V1.

When corrosion of the contact 14 is started (t=t11), the increase of the resistance of the contact 14 which is due to corrosion of the contact 14 occurs, and the detection potential V1 is raised (t11≦t<t12). When the detection potential V1 is raised to be higher than the corrosion potential VX (t=t12), the output signal becomes Lo, and the switching element 20 is set to the conduction state. This causes the corrosion prevention current IA to be passed through the detection conducting path 17, and the detection potential V1 is raised (t12≦t<t13). When the operation of removing corrosion of the contact 14 is started (t=t13), the detection potential V1 is lowered (t13≦t<t14).

When the current passing time period becomes equal to or longer than the driving time period T1 (t=t14), the microcomputer 16A pauses the passing of the corrosion prevention current IA for the pause time period T2 (t14≦t<t15) because the current detection circuit 40 detects that the current is passed through the power-source conducting path 18. When the passing of the corrosion prevention current IA is paused, the output signal becomes Hi. At this time, the microcomputer 16A switches the ground switching element 30 to the conduction state to lower the input impedance of the contact 14. After elapse of the pause time period T2, the microcomputer 16A restarts the voltage supply from the power source 15 (t=15).

Depending on the degree of the progress of the corrosion removal in the contact 14, there occur a case where the contact 14 is restored, and that where the contact 14 is not restored. In theses cases, the contact corrosion preventing apparatus 10A operates in different manners after the restart of the voltage supply. Therefore, the operations of the contact corrosion preventing apparatus 10A in the two cases will be separately described.

In the case where the contact 14 is restored by the removal of corrosion of the contact 14, when the voltage supply is restarted, the detection potential V1 becomes lower than the restoration potential VR, and the comparing and switching unit 12 detects restoration of the contact 14. Therefore, the output signal becomes Hi (the solid line in t14≦t<t15), the switching element 20 is maintained at the non-conduction state, and the connection detection current IB is passed through the detection conducting path 17 (the solid line in t15≦t). As a result, the microcomputer 16A logically determines the connection state of the contact 14 based on the detection potential V1.

In the case where the contact 14 is not restored by the removal of corrosion of the contact 14, when the voltage supply is restarted, the detection potential V1 is higher than the restoration potential VR, and the comparing and switching unit 12 detects corrosion of the contact 14. Therefore, the output signal becomes Lo (the one-dot chain line in t14≦t<t15), the switching element 20 is switched to the conduction state, and the corrosion prevention current IA is passed through the detection conducting path 17 (the one-dot chain line in t15≦t). The corrosion prevention current IA is again passed, whereby the operation of further removing corrosion of the contact 14 is continued to restore the contact 14.

According to the contact corrosion preventing apparatus 10A of the embodiment, when the current passing time period becomes equal to or longer than the driving time period T1, the microcomputer 16A pauses the passing of the current for the pause time period T2. Therefore, the passing of the corrosion prevention current IA is paused for the pause time period T2, whereby the corrosion prevention current IA can be suppressed from continuously flowing for a long term. Namely, excessive passing of the corrosion prevention current IA can be suppressed. Consequently, occurrences of an erroneous determination of the connection state of the contact 14 and a malfunction of the apparatus can be further suppressed. Furthermore, since excessive passing of the corrosion prevention current IA can be suppressed, the lifetime of the contact corrosion preventing apparatus 10A can be further prolonged.

The contact corrosion preventing apparatus 10A of the embodiment achieves the same effects as the contact corrosion preventing apparatus 10 of the first embodiment.

Figure 8:
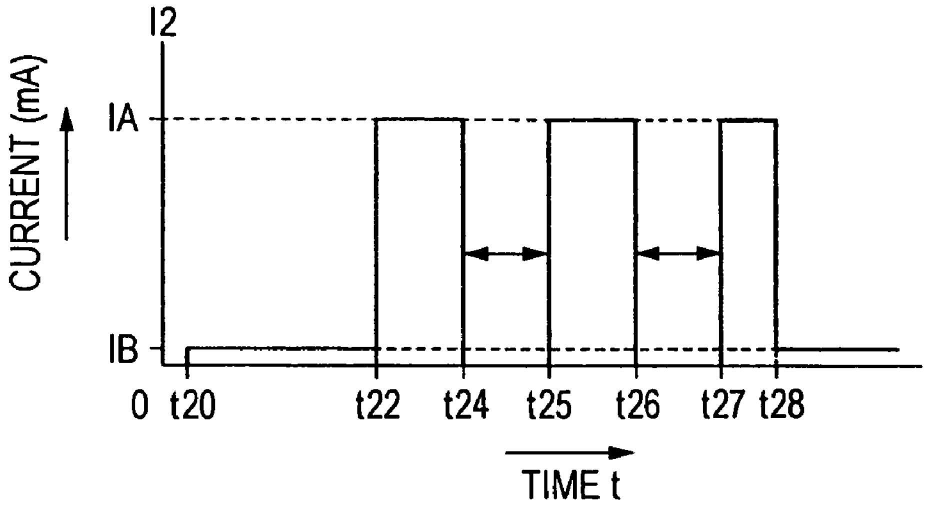
FIG. 8 is a graph showing variation of a current of a detection conducting path 17 of an contact corrosion preventing apparatus 10B of a third embodiment with respect to an elapsed time.
Figure 9:
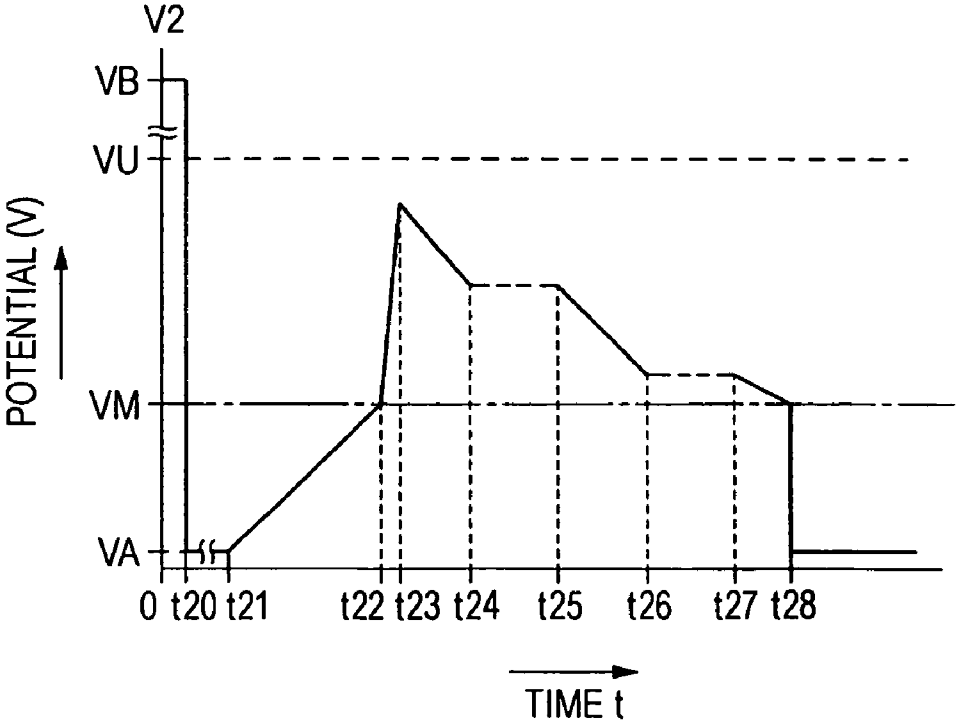
FIG. 9 is a graph showing variation of a detection potential V2 with respect to an elapsed time.
Figure 10:
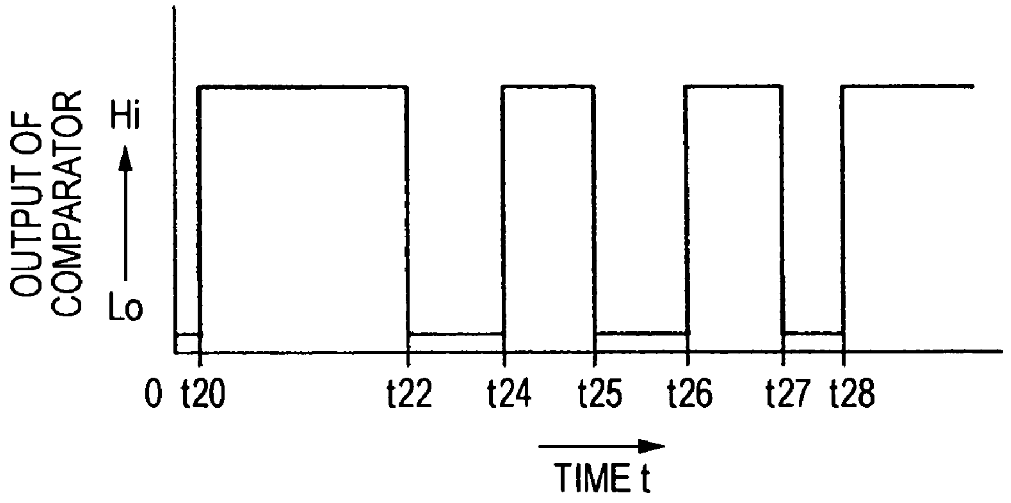
FIG. 10 is a graph showing output variation of a comparing and switching unit 12B with respect to an elapsed time.

FIG. 8 is a graph showing variation of the current of the detection conducting path 17 of an contact corrosion preventing apparatus 10B of a third embodiment with respect to an elapsed time. FIG. 9 is a graph showing variation of a detection potential V2 with respect to an elapsed time. FIG. 10 is a graph showing output variation of a comparing and switching unit 12B with respect to an elapsed time. In FIG. 8, the ordinate indicates the current, and the abscissa indicates the time. In FIG. 9, the ordinate indicates the potential, and the abscissa indicates the time. In FIG. 10, the ordinate indicates the level of the output signal, and the abscissa indicates the time. The contact corrosion preventing apparatus 10B is similar in configuration to the contact corrosion preventing apparatus 10A of the second embodiment. The contact corrosion preventing apparatus 10B has a configuration in which, in the contact corrosion preventing apparatus 10A of the second embodiment, the comparing and switching unit 12B is configured only by the comparator 25, and a microcomputer 16B has a further different function.

The comparing and switching unit 12B is configured by the comparator 25. The comparing and switching unit 12B has a function of comparing the detection potential with a corrosion restoration potential VM. The comparing and switching unit 12B has a function of, when the detection potential becomes higher than the corrosion restoration potential VM, switching the output signal from Hi to Lo, and, when the detection potential becomes lower than the corrosion restoration potential VM, switching the output signal from Lo to Hi. The corrosion restoration potential VM which is a corrosion restoration threshold is a reference potential which is supplied from the reference voltage source 21 to the non-inverting input terminal 25*a*, and, for example, 1 V. The corrosion restoration potential VM is a potential at which corrosion and restoration of the contact 14 can be determined. Specifically, the corrosion restoration potential VM is set to be equal to or lower than the potential VU at which, when the connection detection current IB is passed through the detection conducting path 17, the microcomputer 16B erroneously determines the connection state of the contact 14 that is due to corrosion of the contact 14. The corrosion restoration potential VR, the reference potential at which corrosion and restoration of the contact 14 can be detected is obtained by dividing the power source voltage VB with the first voltage dividing resistor 23 and the second voltage dividing resistor 24. In the same manner as the comparing and switching unit 12 in the second embodiment, the comparing and switching unit 12B has a function of switching the conduction and non-conduction states of the switching element 20 in accordance with the output signal.

The microcomputer 16B has the same functions as the microcomputer 16A in the second embodiment, and further has the following function. The microcomputer 16B has a function of switchingly repeating a current-passing operation of passing the corrosion prevention current IA for the driving time period T1, and a pause operation of pausing the voltage supply from the power source 15 for the pause time period T2.

Hereinafter, the operation of the thus configured contact corrosion preventing apparatus 10B will be described. In a state where the switch 13 is OFF, the detection potential V2 becomes the power source voltage VB (0≦t<t20). Since the detection potential V2 is higher than the corrosion restoration potential VM, the output signal becomes Lo. The current detection circuit 40 transmits to the microcomputer 16B that a current is not passed through the power-source conducting path 18. On the basis of the detection potential V2, the microcomputer 16B logically determines the connection state of the contact 14. When the switch 13 is switched to ON (t=t20), the contact 14 is grounded, and the detection potential V2 becomes the potential VA (t20≦t<t21). The current detection circuit 40 transmits to the microcomputer 16B that a current is passed through the power-source conducting path 18. The detection potential V2 becomes lower than the corrosion restoration potential VM, and the output signal becomes Hi. When the output signal becomes Hi, the switching element 20 is set to the non-conduction state, and the connection detection current IB is passed through the detection conducting path 17 via the resistor 19. Therefore, the microcomputer 16B logically determines the connection state of the contact 14 based on the detection potential V2.

When corrosion of the contact 14 is started (t=t21), the increase of the resistance of the contact 14 which is due to corrosion of the contact 14 occurs, and the detection potential V2 is raised (t21≦t<t22). When the detection potential V2 is raised to be higher than the corrosion restoration potential VM (t=t22), the output signal becomes Lo, and the switching element 20 is set to the conduction state. This causes the corrosion prevention current IA to be passed through the detection conducting path 17, and the detection potential V2 is raised (t22≦t<t23). When the operation of removing corrosion of the contact 14 is started (t=t23), the detection potential V2 is lowered (t23≦t<t24).

When the current passing time period becomes equal to or longer than the driving time period T1 (t=t24), the microcomputer 16B pauses the passing of the corrosion prevention current IA for the pause time period T2 (t24≦t<t25) because the current detection circuit 40 detects that the current is passed through the power-source conducting path 18. When the passing of the corrosion prevention current IA is paused, the output signal becomes Hi. At this time, the microcomputer 16B switches the ground switching element 30 to the conduction state to lower the input impedance of the contact 14. After elapse of the pause time period T2, the microcomputer 16B restarts the voltage supply from the power source 15 (t=25). When the voltage supply is restarted, the output signal becomes Lo because the detection potential V1 is higher than the corrosion restoration potential VM. Therefore, the switching element 20 becomes the conduction state, and the corrosion prevention current IA is passed through the detection conducting path 17. In this way, the microcomputer 16B repeats the current-passing operation and the pause operation to cause the pulse-like corrosion prevention current IA to be passed through the detection conducting path 17 as shown in FIG. 8 (t25≦t<t28). When the pulse-like corrosion prevention current IA is passed and the detection potential V2 becomes lower than the corrosion restoration potential VM (t=t28), the output signal becomes Hi, and the switching element 20 is set to the non-conduction state. This causes the connection detection current IB to be passed through the detection conducting path 17 via the resistor 19 (t28≦t), and the microcomputer 16B logically determines the connection state of the contact 14 based on the detection potential V2.

According to the contact corrosion preventing apparatus 10B of the embodiment, when the variable impedance means 22 is switched to a low impedance, the corrosion prevention current IA is passed through the detection conducting path 17, and, when the variable impedance means 22 is switched to a high impedance, the connection detection current IB is passed through the detection conducting path 17. The comparing and switching unit 12B compares the detection potential V2 with the corrosion restoration potential VM, and, based on a result of the comparison, switches the variable impedance means 22. When the current passing time period becomes equal to or longer than the driving time period T1, the microcomputer 16B pauses the passing of the current for the pause time period T2. Therefore, the passing of the corrosion prevention current IA is paused for the pause time period T2, whereby the corrosion prevention current IA can be suppressed from continuously flowing for a long term. Namely, excessive passing of the corrosion prevention current IA can be suppressed. Consequently, occurrences of an erroneous determination of the connection state of the contact 14 and a malfunction of the apparatus can be suppressed. Furthermore, since excessive passing of the corrosion prevention current IA can be suppressed, the lifetime of the contact corrosion preventing apparatus 10B can be prolonged.

According to the contact corrosion preventing apparatus 10B of the embodiment, corrosion of the contact 14 is removed by repeating the current-passing operation and the pause operation. As compared with the case where the corrosion prevention current IA is continuously passed, therefore, the corrosion prevention current IA can be further suppressed from being excessively passed through the detection conducting path 17.

According to the contact corrosion preventing apparatus of the embodiment, when the pause operation of pausing the passing of the corrosion prevention current is performed, the input impedance of the contact 14 is lowered by the ground switching element 30. Even when the stop operation is performed, therefore, noises can be suppressed from being generated in the detection conducting path 17.

Figure 11:
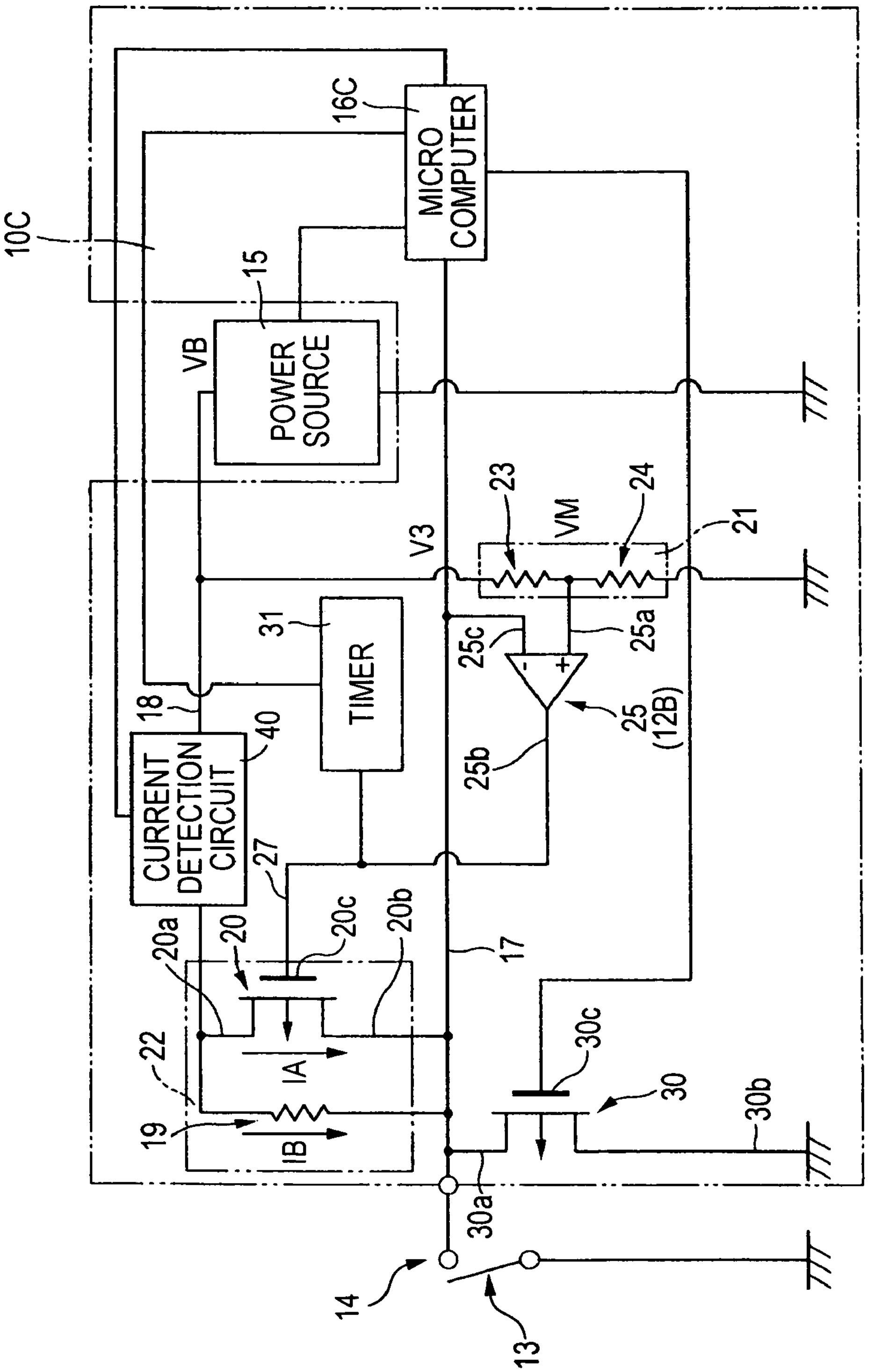
FIG. 11 is a circuit diagram schematically showing a contact corrosion preventing apparatus 10C of a fourth embodiment.

FIG. 11 is a circuit diagram schematically showing a contact corrosion preventing apparatus 10C of a fourth embodiment. The contact corrosion preventing apparatus 10C is similar in configuration to the contact corrosion preventing apparatus 10B of the third embodiment. The contact corrosion preventing apparatus 10C includes a timer 31 in addition to the contact corrosion preventing apparatus 10B of the third embodiment, and a microcomputer 16C has a further different function.

The timer 31 which is counting means is interposed between the microcomputer 16C and the output conducting path 27, and electrically connected to them. The timer 31 has a function of counting the number at which the output signal of Lo is output from the comparing and switching unit 12B. In other words, the timer 31 has a function of counting the number of current-passing operations. The timer 31 is configured so that the number of current-passing operations can be transmitted to the microcomputer 16C. The timer 31 has a function of resetting the number of current-passing operations when the output level of the output signal is unchanged during a predetermined time period.

The microcomputer 16C which is stopping means has the same functions as the microcomputer 16B of the contact corrosion preventing apparatus 10B of the third embodiment, and further has the following function. The microcomputer 16C has a function of, when the number of current-passing operations becomes equal to or larger than a predetermined stop number which is a specified number, stopping the voltage supply of the power source 15. For example, the power source 15 is configured so that, when the voltage supply of the power source 15 is once stopped, the voltage is not supplied unless the user manually restarts the voltage supply.

Figure 12:
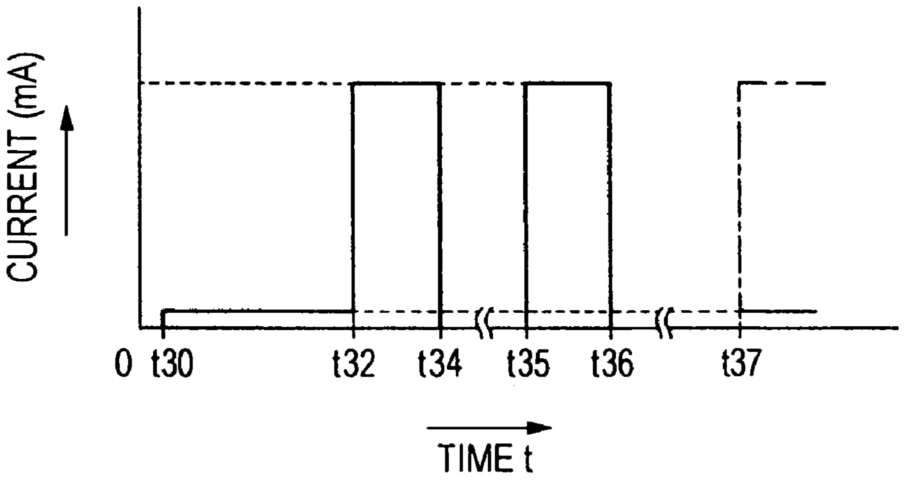
FIG. 12 is a graph showing variation of a current of the detection conducting path 17 with respect to an elapsed time.
Figure 13:
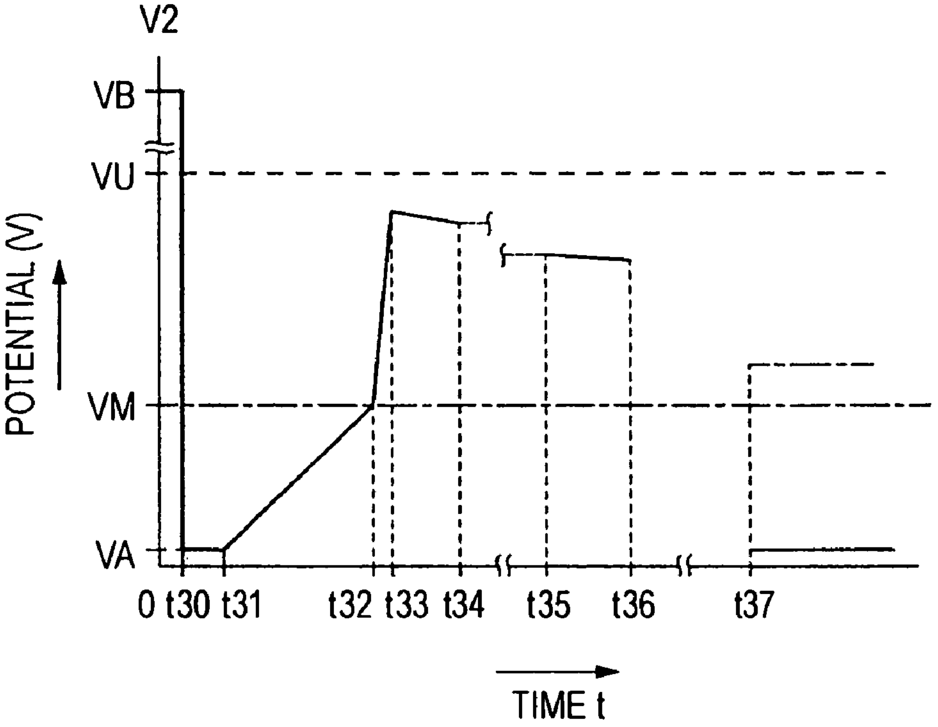
FIG. 13 is a graph showing variation of a detection potential V3 with respect to an elapsed time.
Figure 14:
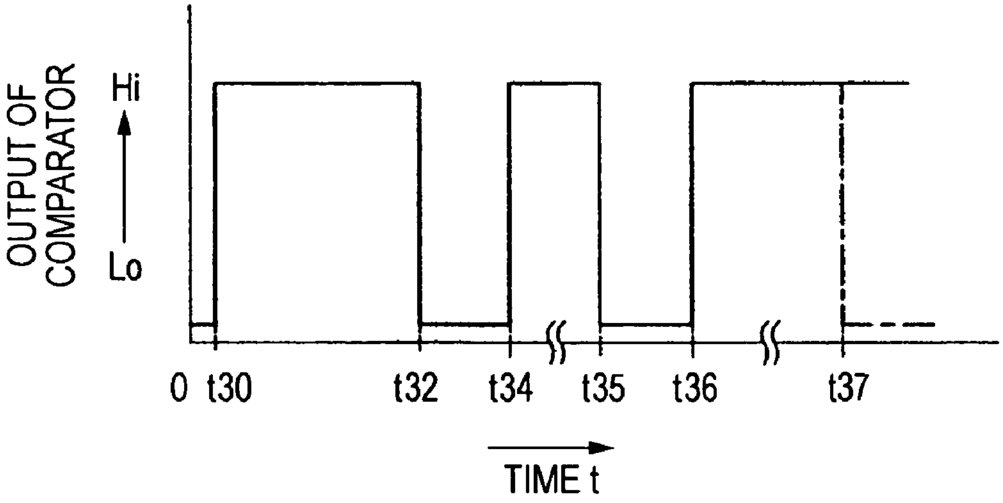
FIG. 14 is a graph showing output variation of the comparing and switching unit 12B with respect to an elapsed time.

FIG. 12 is a graph showing variation of the current of the detection conducting path 17 with respect to an elapsed time. FIG. 13 is a graph showing variation of a detection potential V3 with respect to an elapsed time. FIG. 14 is a graph showing output variation of the comparing and switching unit 12B with respect to an elapsed time. In FIG. 12, the ordinate indicates the current, and the abscissa indicates the time. In FIG. 13, the ordinate indicates the potential, and the abscissa indicates the time. In FIG. 14, the ordinate indicates the level of the output signal, and the abscissa indicates the time. Hereinafter, the operation of the thus configured contact corrosion preventing apparatus 10C will be described. In a state where the switch 13 is OFF, the detection potential V3 becomes the power source voltage VB (0≦t<t30). Since the detection potential V3 is higher than the corrosion restoration potential VM, the output signal becomes Lo. On the basis of the detection potential V3, the microcomputer 16C logically determines the connection state of the contact 14. When the switch 13 is switched to ON (t=t30), the contact 14 is grounded, and the detection potential V3 becomes the potential VA (t30≦t<t31). The detection potential V3 becomes lower than the corrosion restoration potential VM, and the output signal becomes Hi. When the output signal becomes Hi, the switching element 20 is set to the non-conduction state, and the connection detection current IB is passed through the detection conducting path 17 via the resistor 19. Therefore, the microcomputer 16C logically determines the connection state of the contact 14 based on the detection potential V3.

When corrosion of the contact 14 is started (t=t31), the increase of the resistance of the contact 14 which is due to corrosion of the contact 14 occurs, and the detection potential V3 is raised (t31≦t<t32). When the detection potential V3 is raised to be higher than the corrosion restoration potential VM (t=t32), the output signal becomes Lo, and the switching element 20 is set to the conduction state. This causes the corrosion prevention current IA to be passed through the detection conducting path 17, and the detection potential V3 is raised (t32≦t<t33). When the operation of removing corrosion of the contact 14 is started (t=t33), the detection potential V3 is lowered (t33≦t<t34).

When the corrosion prevention current IA is passed through the detection conducting path 17, the microcomputer 16C repeats the current-passing operation and the pause operation plural times until restoration of the contact 14 is detected by the comparing and switching unit 12B, and the pulse-like corrosion prevention current IA is passed through the detection conducting path 17 as shown in FIG. 12 (t34≦t<t35). In the case where restoration of the contact 14 is detected before the number of current-passing operations becomes larger than the stop number, the operation is the same as the contact corrosion preventing apparatus 10B of the third embodiment, and its description is omitted. Hereinafter, the case where restoration of the contact 14 is not detected until the number of current-passing operations becomes equal to or larger than the stop number will be described.

When the number of current-passing operations becomes equal to or larger than the stop number (t=36), the microcomputer 16C passes the corrosion prevention current IA, and then stops the voltage supply of the power source 15. At this time, the microcomputer 16C sets the ground switching element 30 to the conduction state to reduce the input impedance of the contact 14. The timing is not restricted to that after the passing of the corrosion prevention current, and the voltage supply of the power source 15 may be stopped before the passing of the corrosion prevention current.

Sometimes, corrosion of the contact 14 may be removed when it is left to stand for a constant time period after a constant amount of the corrosion prevention current IA is passed. For example, there is a case where corrosion is peeled and removed by repeating the operations of opening and closing the contact 14. In this case, when the voltage supply from the power source 15 is restarted (t=37), the output signal is maintained at Hi, the switching element 20 is set to the non-conduction state, and the connection detection current IB is passed through the detection conducting path 17 (the solid line in t37≦t). This causes the microcomputer 16C to logically determine the connection state of the contact 14 based on the detection potential V3. In the case of a failure of the contact 14 or the like, such as a contact failure of the switch 13, when the voltage supply from the power source 15 is restarted (t=37), the detection potential V3 does not become lower than the corrosion restoration potential VM, the output signal becomes Lo, and the switching element 20 is set to the conduction state. Therefore, the corrosion prevention current IA is again passed (t37≦t). The voltage supply of the power source is restarted, and it is possible to determine whether the potential rise is due to corrosion of the detection potential contact 14 or due to a failure of the switch 13.

According to the contact corrosion preventing apparatus 10C of the embodiment, the timer 31 counts the number of current-passing operations of passing the corrosion prevention current IA. When the number of current-passing operations becomes equal to or larger than the stop number, the microcomputer 16C stops the voltage supply of the power source 15, and stops the passing of the corrosion prevention current IA. Therefore, the corrosion prevention current IA can be suppressed from accumulating in the detection conducting path 17 and excessively passing by repetition of the current-passing operation and the pause operation. Consequently, occurrences of an erroneous determination of the connection state of the contact 14 of the contact corrosion preventing apparatus 10C and a malfunction of the apparatus can be further suppressed. Furthermore, since excessive passing of the corrosion prevention current IA can be suppressed, the lifetime of the contact corrosion preventing apparatus 10C can be further prolonged.

In the case of an erroneous determination of corrosion of the contact 14 due to a failure of the contact 14 or the like, in the contact corrosion preventing apparatus of the conventional art, the corrosion prevention current IA continues to be excessively passed. In conjunction with a failure of the contact 14 or the like, such as a contact failure of the switch 13, therefore, the contact corrosion preventing apparatus of the conventional art breaks down. In the contact corrosion preventing apparatus 10C of the embodiment, when the number of the current-passing operations becomes equal to or larger than the stop number, passing of the corrosion prevention current IA is stopped, and the contact corrosion preventing apparatus 10C can be prevented from breaking down in conjunction with a failure of the contact 14 or the like. When the voltage supply of the power source 15 is restarted, it is possible to determine whether this is caused by corrosion of the contact 14 or a failure of the contact 14 or the like.

According to the contact corrosion preventing apparatus 10C of the embodiment, when the stop operation of stopping the passing of the corrosion prevention current IA is performed, the input impedance of the contact 14 is lowered by the ground switching element 30. Even when the stop operation is performed, therefore, noises can be suppressed from being generated in the detection conducting path 17.

Figure 15:
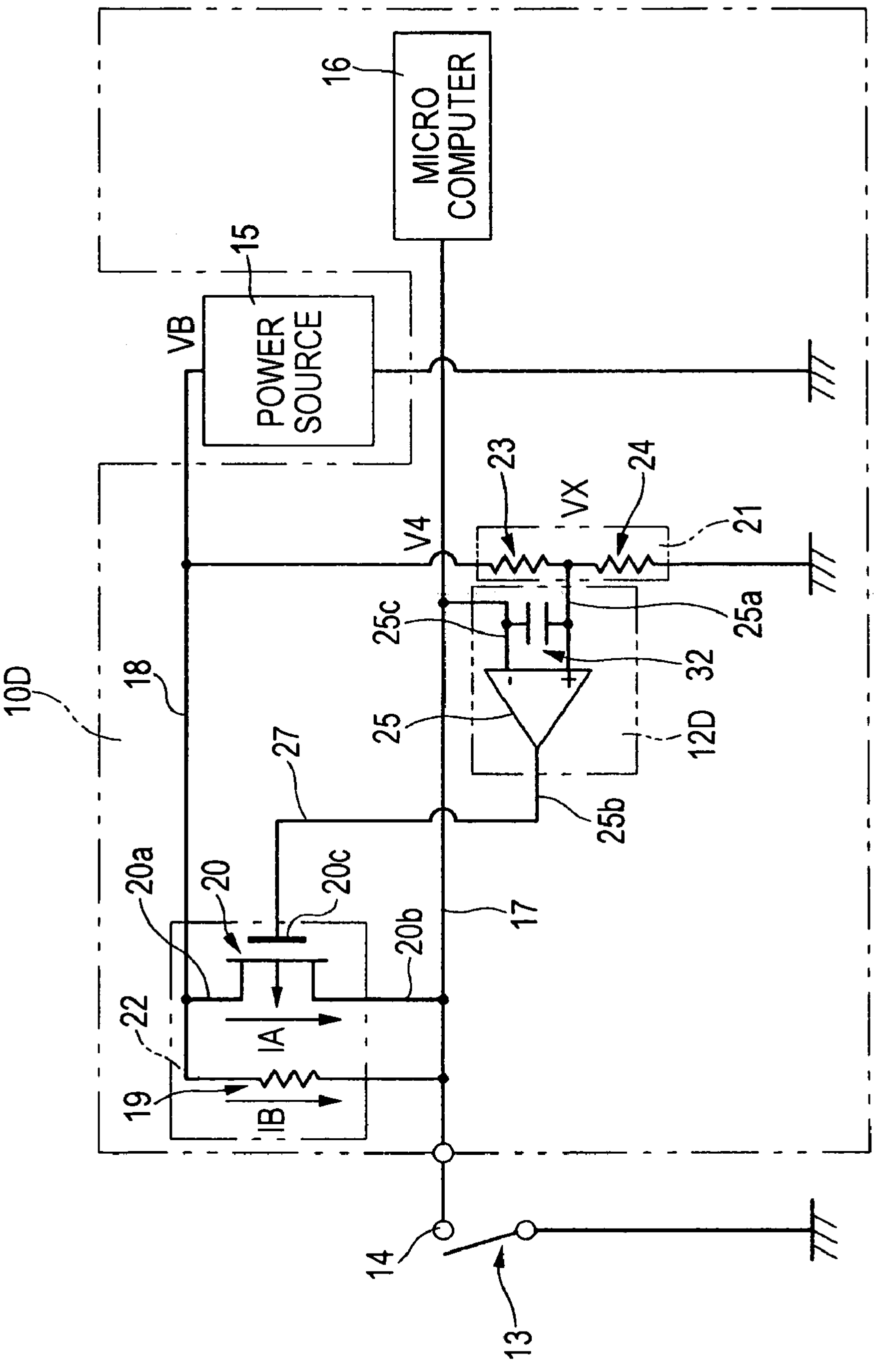
FIG. 15 is a circuit diagram schematically showing a contact corrosion preventing apparatus 10D of a fifth embodiment.
Figure 16:
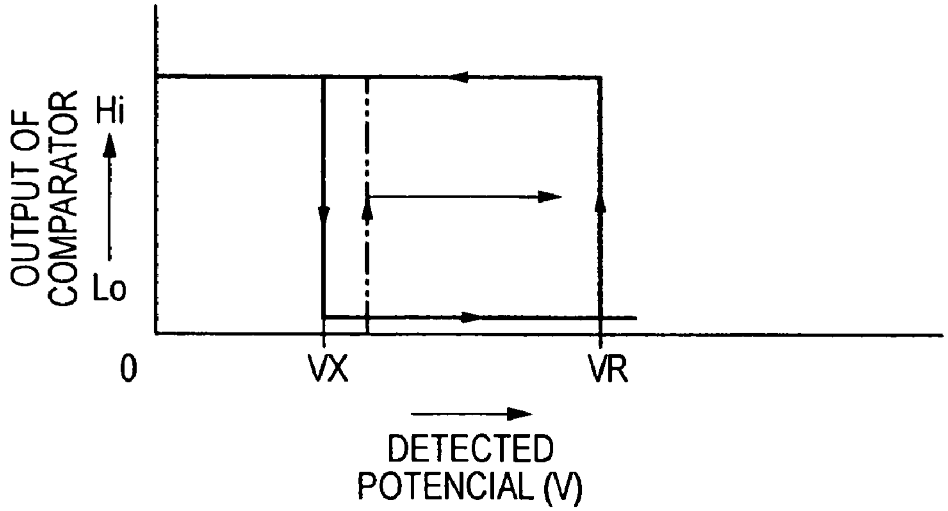
FIG. 16 is a graph showing the output characteristic of a comparing and switching unit 12D.

FIG. 15 is a circuit diagram schematically showing a contact corrosion preventing apparatus 10D of a fifth embodiment. FIG. 16 is a graph showing the output characteristic of a comparing and switching unit 12D. In FIG. 16, the ordinate indicates the level of an output signal, and the abscissa indicates the potential. The contact corrosion preventing apparatus 10D is similar in configuration to the contact corrosion preventing apparatus 10 of the first embodiment.

The comparing and switching unit 12D is configured by the comparator 25 and a capacitor 32. One end of the capacitor 32 is electrically connected to the inverting input terminal 25*c* of the comparator 25, and the other end to the non-inverting input terminal 25*a* of the comparator 25. The comparing and switching unit 12D has a function of comparing the detection potential with the corrosion potential VX and the restoration potential VR. The comparing and switching unit 12D has a function of, when the detection potential becomes higher than the corrosion potential VX, switching the output signal from Hi to Lo. The comparing and switching unit 12D has a function of, when the detection potential becomes lower than the restoration potential VR, switching the output signal from Lo to Hi. In the comparing and switching unit 12D, when the detection potential is raised, the capacitor 32 is charged. According to the configuration, in the comparing and switching unit 12D, when the detection potential becomes higher than the corrosion potential VX, the capacitor 32 causes the potential of the non-inverting input terminal 25*a* to be raised, and hence the restoration potential VR is varied. Specifically, the comparing and switching unit has a function of raising the restoration potential VR (FIG. 16). In the same manner as the comparing and switching unit 12D in the first embodiment, the comparing and switching unit 12D has a function of switching the switching element 20 to either of the conduction state and the non-conduction state.

Figure 17:
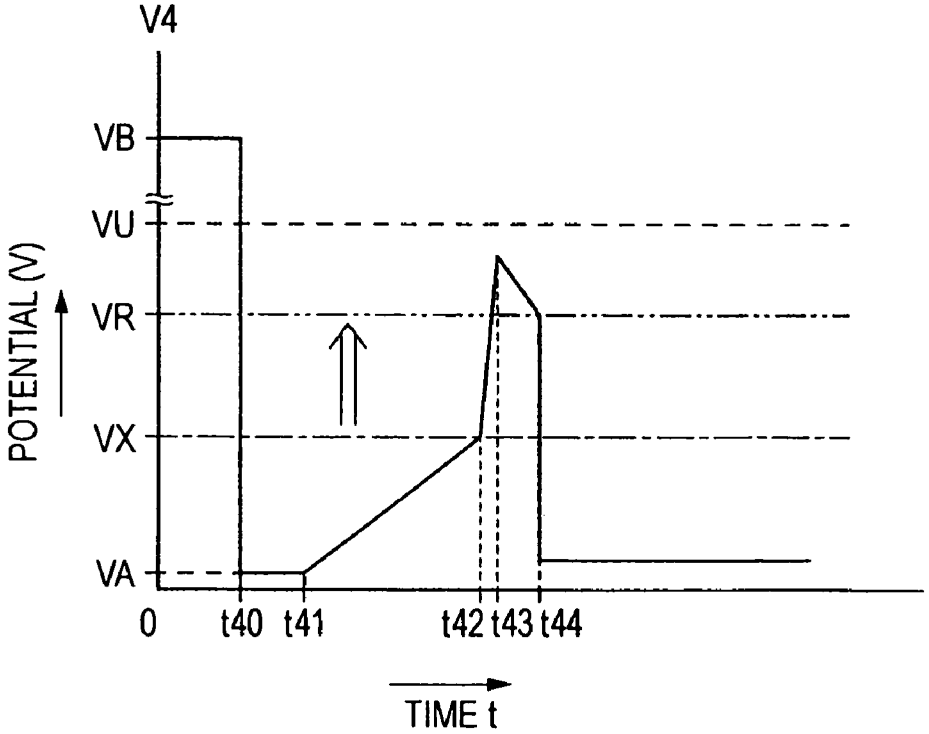
FIG. 17 is a graph showing variation of a detection potential V4 with respect to an elapsed time.
Figure 18:
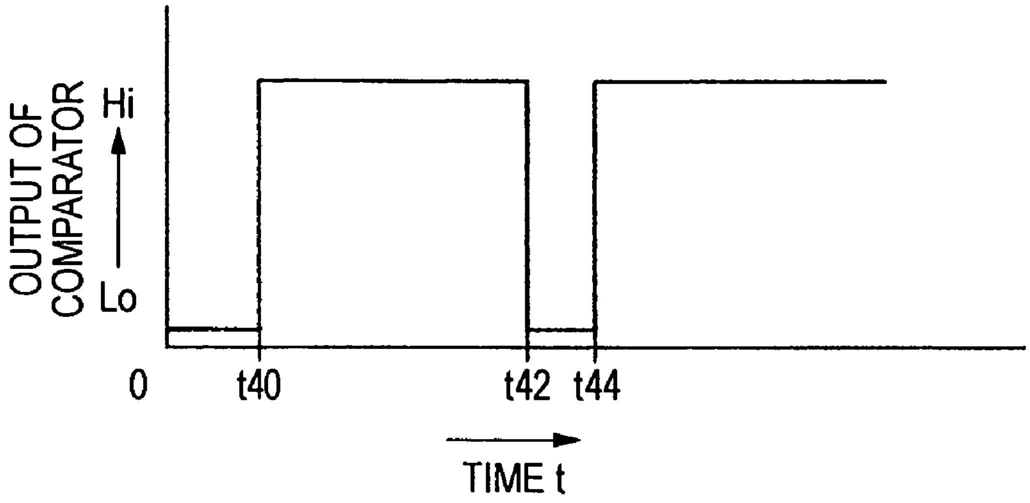
FIG. 18 is a graph showing output variation of the comparing and switching unit 12D with respect to an elapsed time.

FIG. 17 is a graph showing variation of a detection potential V4 with respect to an elapsed time. FIG. 18 is a graph showing output variation of the comparing and switching unit 12D with respect to an elapsed time. In FIG. 17, the ordinate indicates the potential, and the abscissa indicates the time. In FIG. 18, the ordinate indicates the level of the output signal, and the abscissa indicates the time. Hereinafter, the operation of the thus configured contact corrosion preventing apparatus 10D will be described. In the state where the switch 13 is OFF, the detection potential V4 becomes the power source voltage VB (0≦t<t40), and the output signal becomes Lo. On the basis of the detection potential V4, the microcomputer 16 logically determines the connection state of the contact 14. When the switch 13 is switched to ON (t=t40), the contact 14 is grounded, and the detection potential V4 becomes the potential VA (t40≦t<t41), and the output signal becomes Hi. When the output signal becomes Hi, the switching element 20 is set to the non-conduction state, and the connection detection current IB is passed through the detection conducting path 17. The microcomputer 16 logically determines the connection state of the contact 14 based on the detection potential V4.

When corrosion of the contact 14 is started (t=t41), the detection potential V4 is raised (t41≦t<t42). When the detection potential V4 is raised to be higher than the corrosion potential VX (t=t42), the output signal becomes Lo, and the switching element 20 is set to the conduction state. This causes the corrosion prevention current IA to be passed through the detection conducting path 17, and the detection potential V4 is raised (t42≦t<t43). In conjunction with the rise of the detection potential V4, also the restoration potential VR is raised. When the operation of removing corrosion of the contact 14 is started (t=t43), the detection potential V4 is lowered (t43≦t<t44). When the detection potential V4 becomes lower than the restoration potential VR (t=t44), the output signal becomes Hi, the switching element 20 is set to the non-conduction state, and the connection detection current IB is passed through the detection conducting path 17 (t44≦t). As a result, the microcomputer 16 logically determines the connection state of the contact 14 based on the detection potential V4.

Hereinafter, effects achieved by the thus configured contact corrosion preventing apparatus 10D will be described. According to the contact corrosion preventing apparatus 10D of the embodiment, the comparing and switching unit 12D varies the restoration potential VR on the basis of the detection potential V4. As compared with the case where the restoration potential VR is uniformly determined, therefore, the excessive corrosion prevention current IA passing through the detection conducting path 17 can be suppressed. Therefore, an erroneous determination of the connection state of the contact 14 of the contact corrosion preventing apparatus 10D and a malfunction of the apparatus can be further suppressed. Furthermore, since excessive passing of the corrosion prevention current IA can be suppressed, the lifetime of the contact corrosion preventing apparatus 10D can be prolonged.

According to the contact corrosion preventing apparatus 10D of the embodiment, since the restoration potential VR is raised by discharging of the capacitor 32, the rise is started with being delayed with respect to the rise of the detection potential, and the potential is not set to a potential which is higher than the detection potential. Therefore, lowering of the detection potential can be surely detected. Namely, start of removal of corrosion of the contact 14 can be surely detected.

According to the contact corrosion preventing apparatus 10D of the embodiment, the restoration potential VR is varied in accordance with the detection potential V4. The detection potential V4 which is detected during passing of the corrosion prevention current IA is different depending on the corrosion status of the contact 14, the configuration of the switch 13, and the like. When the restoration potential VR is uniformly determined, therefore, there is the possibility that the excessive corrosion prevention current IA is passed. The restoration potential VR is varied depending on the detection potential V4, so that the excessive corrosion prevention current IA can be further suppressed from being passed.

The contact corrosion preventing apparatus 10D of the embodiment achieves the same effects as the contact corrosion preventing apparatus 10 of the first embodiment.

Figure 19:
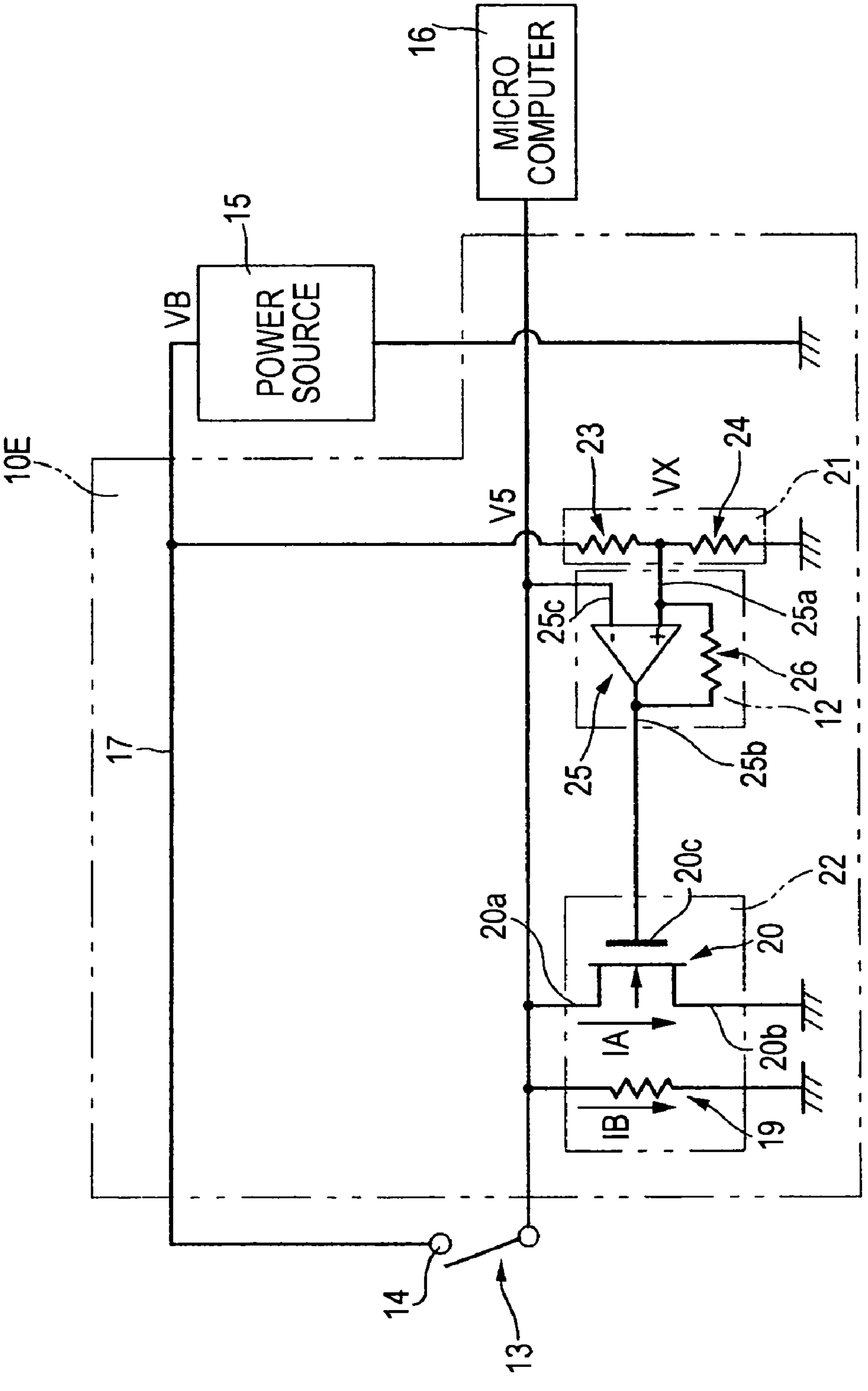
FIG. 19 is a circuit diagram schematically showing a contact corrosion preventing apparatus 10E of a sixth embodiment.

FIG. 19 is a circuit diagram schematically showing a contact corrosion preventing apparatus 10E of a sixth embodiment. The contact corrosion preventing apparatus 10E is similar in configuration to the contact corrosion preventing apparatus 10 of the first embodiment. Specifically, in the contact corrosion preventing apparatus 10 of the first embodiment, the switch 13 is disposed on the grounding side with respect to the detection conducting path 17, i.e., on the low side. By contrast, in the contact corrosion preventing apparatus 10E of the sixth embodiment, the switch 13 is interposed on the side of the power source 15 with respect to the detection conducting path 17, i.e., on the high side.

One end of the detection conducting path 17 is electrically connected to the power source 15, and the other end to the microcomputer 16. The switch 13 is interposed in the detection conducting path 17, and the contact 14 is electrically connected to the side of the power source 15. One end of the resistor 19 and that of the switching element 20 are electrically connected in parallel to the detection conducting path 17, and the other ends are grounded. One end of the reference voltage source 21 is electrically connected between the power source 15 of the detection conducting path 17 and the contact 14, and the other end is grounded. In the comparing and switching unit 12D, the inverting input terminal 25*c* is electrically connected to a point of the detection conducting path 17 which is on the side of the microcomputer 16 with respect to the switching element 20, the non-inverting input terminal 25*a* to the reference voltage source 21, and the output terminal 25*b* to the gate 20*c* of the switching element 20. An n-channel MOSFET transistor is used as the switching element 20.

When the switch 13 is disposed on the high side as in the embodiment, the corrosion potential VX is set to be higher than the restoration potential VR. As compared with the first embodiment, namely, the level relationship between the corrosion potential VX and the restoration potential VR is inverted. Specifically, the comparing and switching unit 12 has a function of, when the detection potential is lowered to become lower than the corrosion potential VX, switching the output signal from Lo to Hi, and, when the detection potential is raised to become higher than the restoration potential VR, switching the output signal from Hi to Lo. The comparing and switching unit 12 has a function of, when the output signal becomes Hi, switching the switching element 20 to the conduction state, and, when the output signal becomes Lo, switching the switching element 20 to the non-conduction state. The microcomputer 16 determines Lo and Hi of the input signal, and, in the case where the input signal is Lo, determines that the connection state of the contact 14 is a closed state, and, in the case where the input signal is Hi, determines that the connection state of the contact 14 is an opened state.

Figure 20:
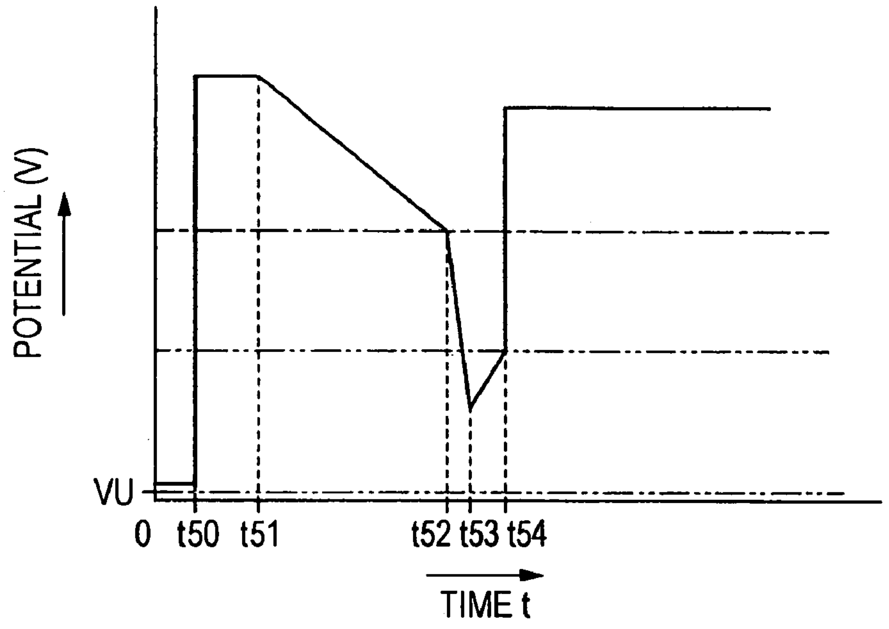
FIG. 20 is a graph showing variation of a detection potential V5 with respect to an elapsed time.
Figure 21:
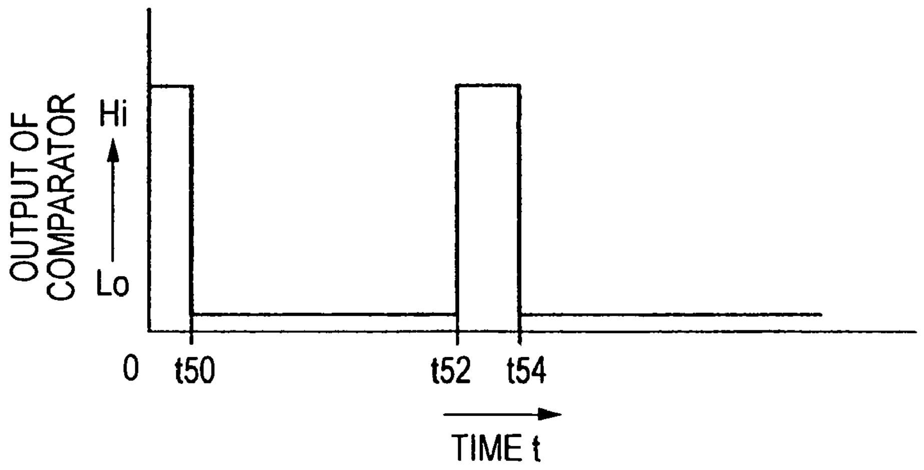
FIG. 21 is a graph showing output variation of the comparing and switching unit 12 with respect to an elapsed time.

FIG. 20 is a graph showing variation of a detection potential V5 with respect to an elapsed time. FIG. 21 is a graph showing output variation of the comparing and switching unit 12 with respect to an elapsed time. In FIG. 20, the ordinate indicates the potential, and the abscissa indicates the time. In FIG. 21, the ordinate indicates the level of the output signal, and the abscissa indicates the time. Hereinafter, the operation of the thus configured contact corrosion preventing apparatus 10E will be described. In the state where the switch 13 is OFF, the detection potential V5 becomes the potential VA (0≦t<t50), and the output signal becomes Hi. On the basis of the detection potential V5, the microcomputer 16 logically determines the connection state of the contact 14. When the switch 13 is switched to ON (t=t50), the contact 14 is grounded, the detection potential V5 becomes the power source voltage VB (t50≦t<t51), and the output signal becomes Lo. When the output signal becomes Lo, the switching element 20 is set to the non-conduction state, and the connection detection current IB is passed through the detection conducting path 17. The microcomputer 16 logically determines the connection state of the contact 14 based on the detection potential VS.

When corrosion of the contact 14 is started (t=t51), the detection potential V5 is lowered (t51≦t<t52). When the detection potential V5 is lowered to be lower than the corrosion potential VX (t=t52), the output signal becomes Hi, and the switching element 20 is set to the conduction state. This causes the corrosion prevention current IA to be passed, and the detection potential V5 is lowered (t52≦t<t53). When the operation of removing corrosion of the contact 14 is started (t=t53), the detection potential V5 is raised (t53≦t<t54). When the detection potential V5 is raised to be higher than the restoration potential VR (t=t54), the output signal becomes Lo, and the switching element 20 is set to the non-conduction state. Therefore, the connection detection current IB is passed (t54≦t), and the microcomputer 16 logically determines the connection state of the contact 14 based on the detection potential V5.

According to the contact corrosion preventing apparatus 10E of the embodiment, the switch 13 is disposed on the high side. Even when the switch 13 is disposed not only on the low side, but also on the high side, therefore, the contact corrosion preventing apparatus 10E can be realized.

In the contact corrosion preventing apparatuses of the second to fifth embodiments, the switch 13 is disposed on the low side. Even when disposed on the high side, however, the same effects are achieved in the respective embodiments. In the contact corrosion preventing apparatus 10E of the embodiment, one switch 13 is disposed. However, the invention is not restricted to it, and plural switches 13 may be disposed. Although the embodiment includes the switch 13, alternatively a connector may be used.

In the embodiment, the timer 31 counts only the number of current-passing operations, and alternatively may count the number of pause operations. According to the configuration, when the number of pause operations becomes equal to or larger than the stop number, the microcomputers 16C, 16D can stop the voltage supply of the power source 15. Alternatively, the timer 31 may count both the number of current-passing operations and that of pause operations. When at least one the numbers of current-passing operations and pause operations becomes equal to or larger than the stop number, the microcomputers 16C, 16D can stop the voltage supply of the power source 15. They achieve the same effects as those in the case where the microcomputers 16C, 16D stop the voltage supply of the power source 15 on the basis of the number of current-passing operations.

Figure 22:
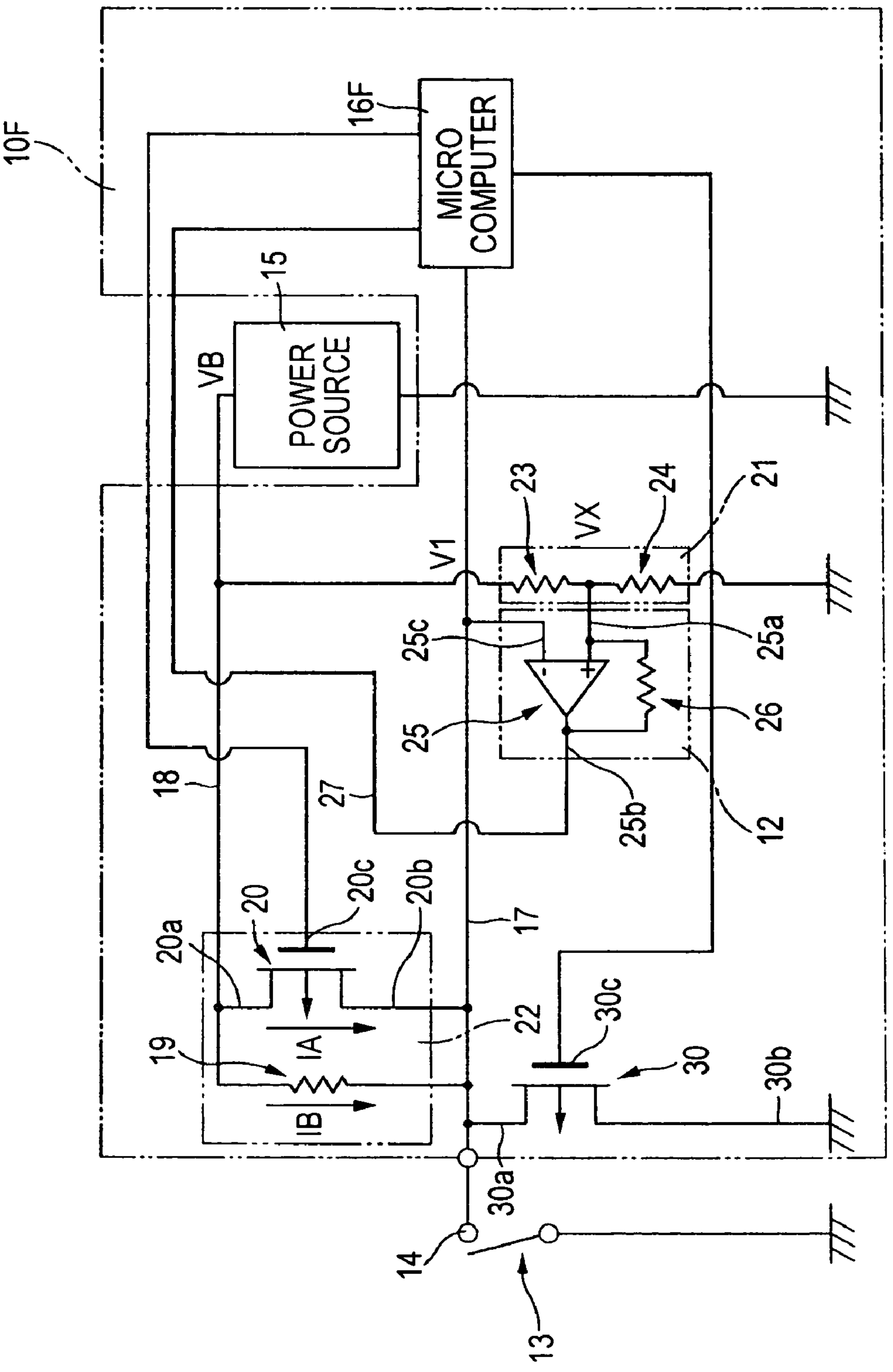
FIG. 22 is a circuit diagram schematically showing a contact corrosion preventing apparatus 10F of a seventh embodiment.

FIG. 22 is a circuit diagram schematically showing a contact corrosion preventing apparatus 10F of a seventh embodiment. The contact corrosion preventing apparatus 10F is similar in configuration to the contact corrosion preventing apparatus 10 of the first embodiment. The contact corrosion preventing apparatus 10F includes the ground switching element 30 in addition to the contact corrosion preventing apparatus 10 of the first embodiment, and a microcomputer 16F is included in the contact corrosion preventing apparatus 10F.

In the contact corrosion preventing apparatus 10F, the output terminal 25*b* of the comparator 25 is electrically connected to the microcomputer 16F. The microcomputer 16F which is pausing means is further electrically connected to the gate 20*c* of the switching element 20. The microcomputer 16F has the same functions as the microcomputer 16 in the first embodiment, and further has the following functions. The microcomputer 16F has functions of obtaining the output signal, and, based on the output signal, switching the conduction state and non-conduction state of the switching element 20. Specifically, the microcomputer 16F has a function of, when the output signal of Lo is obtained, supplying the signal of Lo to the switching element 20 to switch the switching element 20 to the conduction state. The microcomputer 16F has a function of, when the output signal of Hi is obtained, supplying the signal of Hi to the switching element 20 to switch the switching element 20 to the non-conduction state.

The microcomputer 16F has further a function of counting the time period when the output signal of Lo is output, i.e., the current passing time period when the corrosion prevention current IA continues to be passed. The microcomputer 16F has a function of, when the current passing time period becomes equal to or longer than the driving time period T1, transmitting the signal of Hi to the switching element 20 for the pause time period T2 to switch the switching element 20 to the non-conduction state. In other words, the microcomputer 16F has a function of, when the current passing time period becomes equal to or longer than the driving time period T1, pausing the passing of the corrosion prevention current IA, and passing the connection detection current IB. The microcomputer 16F has a function of, after elapse of the pause time period T2, transmitting the signal of Lo to the switching element 20 to switch the switching element 20 to the conduction state.

Figure 23:
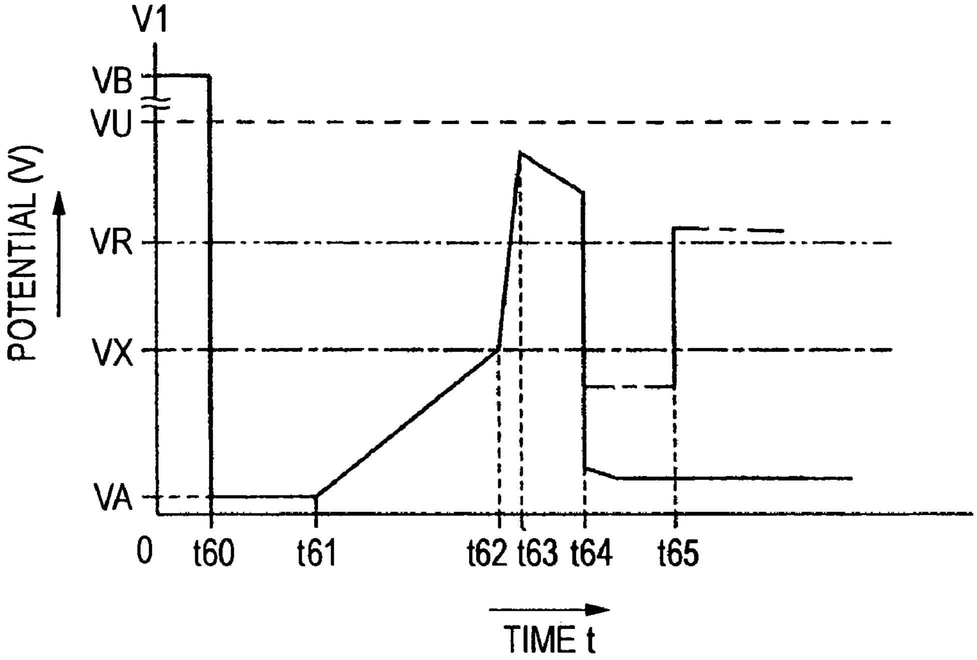
FIG. 23 is a graph showing variation of a detection potential V6 with respect to an elapsed time.
Figure 24:
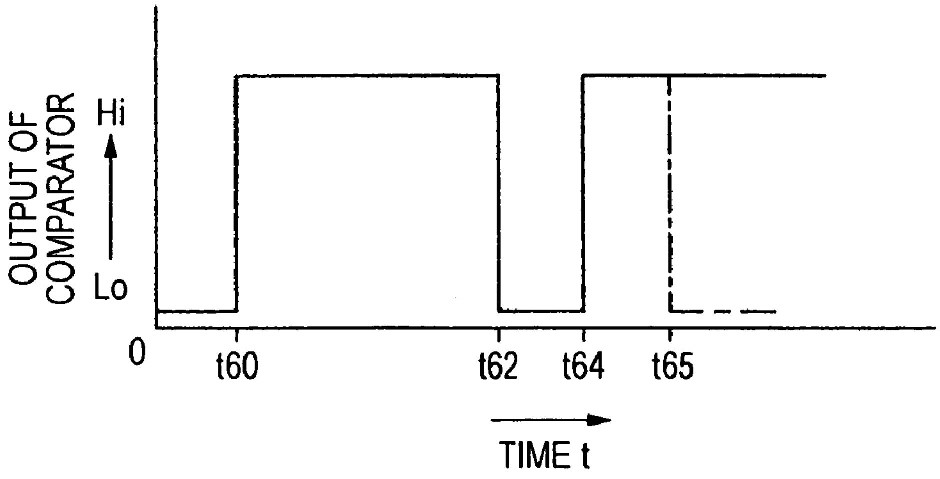
FIG. 24 is a graph showing output variation of the comparing and switching unit 12 with respect to an elapsed time.

FIG. 23 is a graph showing variation of a detection potential V6 with respect to an elapsed time. FIG. 24 is a graph showing output variation of the comparing and switching unit 12 with respect to an elapsed time. In FIG. 23, the ordinate indicates the potential, and the abscissa indicates the time. In FIG. 24, the ordinate indicates the level of the output signal, and the abscissa indicates the time. Hereinafter, the operation of the thus configured contact corrosion preventing apparatus 10F will be described. In the state where the switch 13 is OFF, the detection potential V6 becomes the power source voltage VB (0≦t<t60). Since the detection potential V6 is higher than the corrosion potential VX, the output signal becomes Lo. On the basis of the detection potential V6, the microcomputer 16 logically determines the connection state of the contact 14. When the switch 13 is switched to ON (t=60), the contact 14 is grounded, and the detection potential V6 becomes the potential VA (t60≦t<t61). The detection potential V6 becomes lower than the restoration potential VR, and the output signal becomes Hi. When the output signal becomes Hi, the microcomputer 16F switches the switching element 20 to the non-conduction state, and the connection detection current IB is passed through the detection conducting path 17 via the resistor 19. Therefore, the microcomputer 16F logically determines the connection state of the contact 14 based on the detection potential V1.

When corrosion of the contact 14 is started (t=t61), the increase of the resistance of the contact 14 which is due to corrosion of the contact 14 occurs, and the detection potential V6 is raised (t61≦t<t62). When the detection potential V6 is raised to be higher than the corrosion potential VX (t=t62), the output signal becomes Lo, and the microcomputer 16F switches the switching element 20 to the conduction state. This causes the corrosion prevention current IA to be passed through the detection conducting path 17, and the detection potential V6 is raised (t62≦t<t63). When the operation of removing corrosion of the contact 14 is started (t=t63), the detection potential V6 is lowered (t63≦t<t64).

When the current passing time period becomes equal to or longer than the driving time period T1 (t=t64), the microcomputer 16F pauses the passing of the corrosion prevention current IA for the pause time period T2, and the connection detection current IB is passed (t64≦t<t65). At this time, the microcomputer 16F switches the ground switching element 30 to the conduction state to lower the input impedance of the contact 14. After elapse of the pause time period T2, the microcomputer 16F transmits the signal of Lo to the switching element 20 (t=65).

Depending on the degree of the progress of the corrosion removal in the contact 14, there occur a case where the contact 14 is restored, and that where the contact 14 is not restored. In theses cases, the contact corrosion preventing apparatus 10F operates in different manners after the restart of the passing of the corrosion prevention current IA. Therefore, the operations of the contact corrosion preventing apparatus 10F in the two cases will be separately described.

In the case where the contact 14 is restored by the removal of corrosion of the contact 14, when the passing of the corrosion prevention current IA is restarted, the detection potential V1 becomes lower than the restoration potential VR, and the comparing and switching unit 12 detects restoration of the contact 14. Therefore, the output signal becomes Hi (the solid line in t65≦t), the switching element 20 is maintained at the non-conduction state, and the connection detection current IB is passed through the detection conducting path 17 (the solid line in t65≦t). As a result, the microcomputer 16F logically determines the connection state of the contact 14 based on the detection potential V6.

In the case where the contact 14 is not restored by the removal of corrosion of the contact 14, when the passing of the corrosion prevention current IA is restarted, the detection potential V6 is higher than the restoration potential VR, and the comparing and switching unit 12 detects corrosion of the contact 14. Therefore, the output signal becomes Lo (the one-dot chain line in t65≦t), the switching element 20 is switched to the conduction state, and the corrosion prevention current IA is passed through the detection conducting path 17 (the one-dot chain line in t65≦t). The corrosion prevention current IA is again passed, whereby the operation of further removing corrosion of the contact 14 is continued to restore the contact 14.

According to the contact corrosion preventing apparatus 10F of the embodiment, when the current passing time period becomes equal to or longer than the driving time period T1, the microcomputer 16F pauses the passing of the corrosion prevention current IA for the pause time period T2. Therefore, the passing of the corrosion prevention current IA is paused for the pause time period T2, whereby the corrosion prevention current IA can be suppressed from continuously flowing for a long term. Namely, excessive passing of the corrosion prevention current IA can be suppressed. Consequently, occurrences of an erroneous determination of the connection state of the contact 14 and a malfunction of the apparatus can be further suppressed. Furthermore, since excessive passing of the corrosion prevention current IA can be suppressed, the lifetime of the contact corrosion preventing apparatus 10F can be further prolonged.

According to the contact corrosion preventing apparatus 10F of the embodiment, when the current passing time period becomes equal to or longer than the driving time period T1, the microcomputer 16F pauses the passing of the corrosion prevention current IA for the pause time period T2, and passes the connection detection current IB. Therefore, excessive passing of the corrosion prevention current IA can be suppressed in a state where a standby voltage is supplied, without pausing the power source 15.

The contact corrosion preventing apparatus 10F of the embodiment achieves the same effects as the contact corrosion preventing apparatus 10 of the first embodiment.

Figure 25:
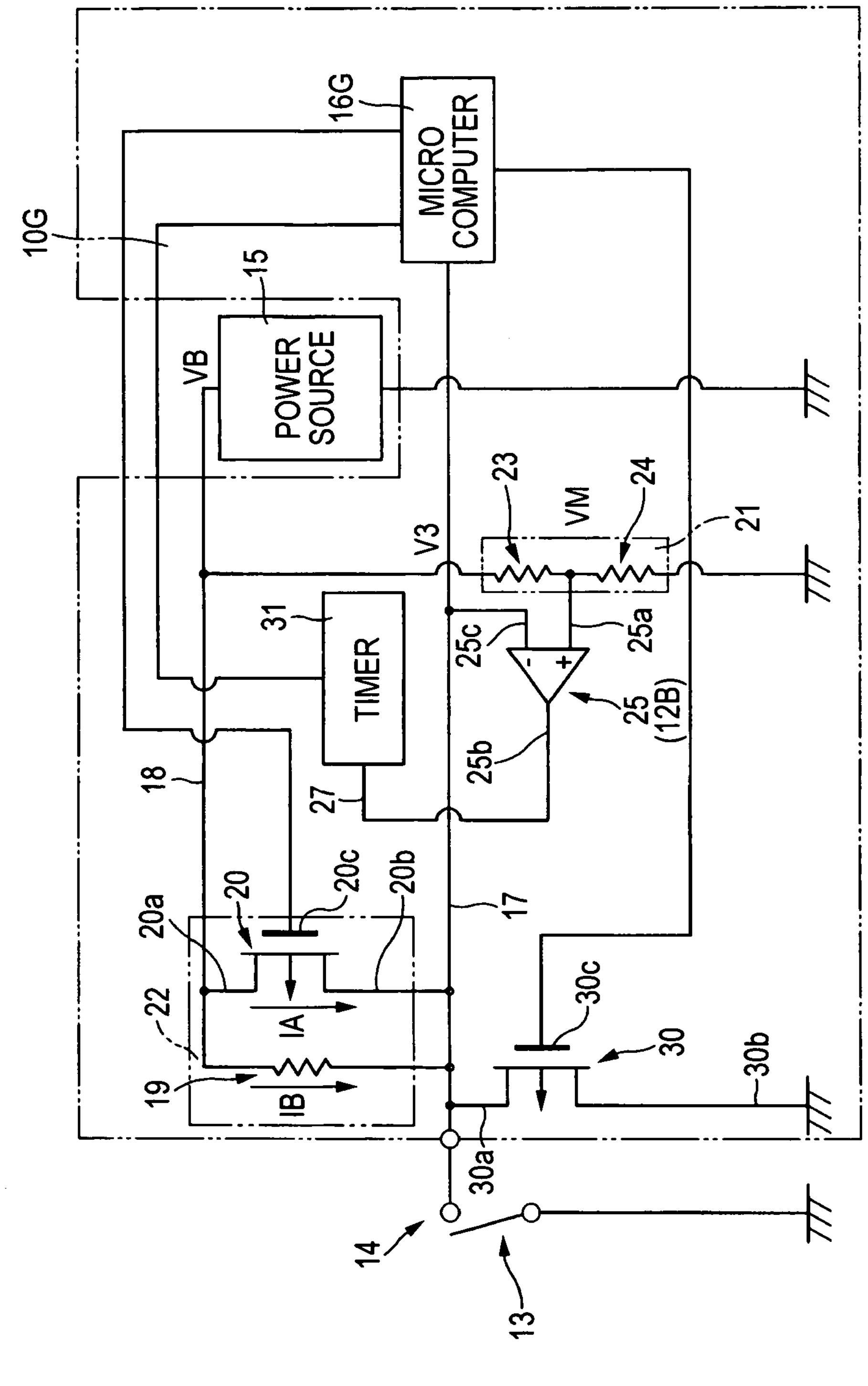
FIG. 25 is a circuit diagram schematically showing a contact corrosion preventing apparatus 10G of an eighth embodiment.

FIG. 25 is a circuit diagram schematically showing a contact corrosion preventing apparatus 10G of an eighth embodiment. The contact corrosion preventing apparatus 10G is similar in configuration to the contact corrosion preventing apparatus 10F of the seventh embodiment. The contact corrosion preventing apparatus 10G has a configuration in which, in the contact corrosion preventing apparatus 10F of the second embodiment, the comparing and switching unit 12B is replaced with the comparing and switching unit 12B, the timer 31 is interposed in the output conducting path 27, and a microcomputer 16G has a further different function.

The microcomputer 16G has the same functions as the microcomputer 16F in the seventh embodiment, and further has the following functions. The microcomputer 16G has a function of switchingly repeating a current-passing operation of passing the corrosion prevention current IA for the driving time period T1, and a pause operation of pausing the corrosion prevention current IA for the pause time period T2, and passing the connection detection current IB. The microcomputer 16G is electrically connected to the power source 15, and has a function of, when the number of current-passing operations becomes equal to or larger than the stop number, stopping the voltage supply of the power source 15.

Figure 26:
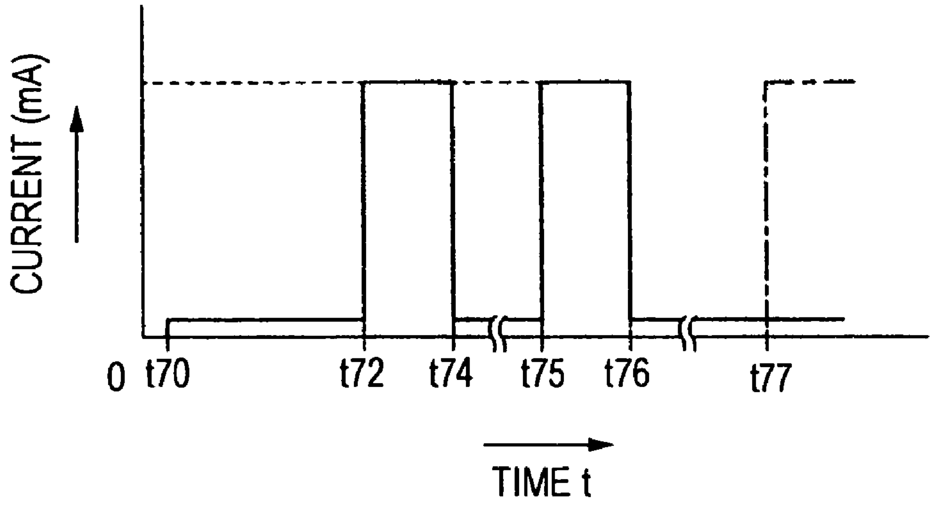
FIG. 26 is a graph showing variation of a current of the detection conducting path 17 of the contact corrosion preventing apparatus 10G with respect to an elapsed time.
Figure 27:
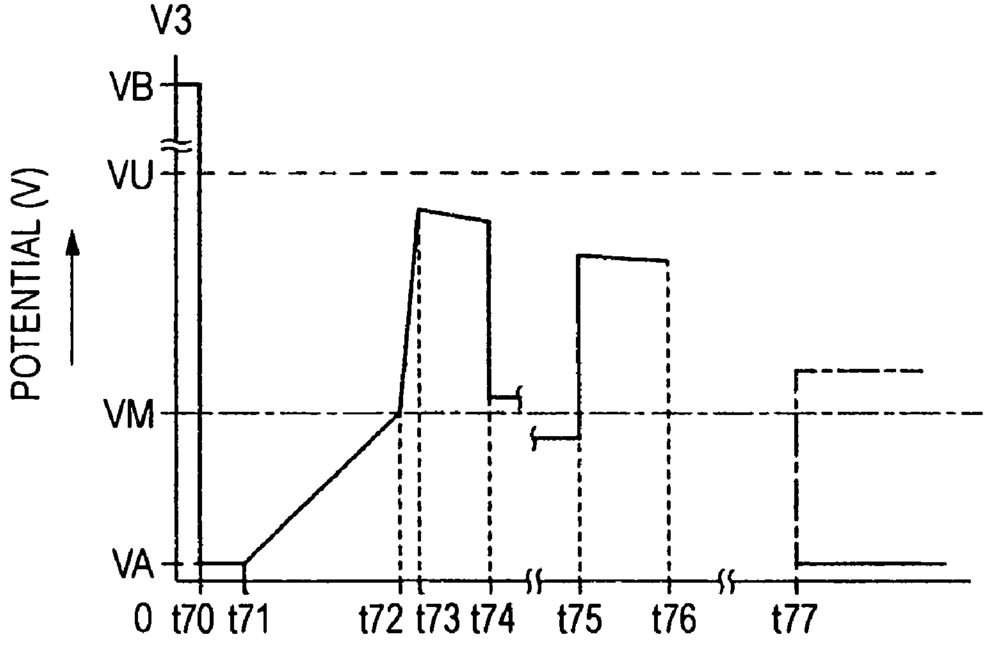
FIG. 27 is a graph showing variation of a detection potential V7 with respect to an elapsed time.
Figure 28:
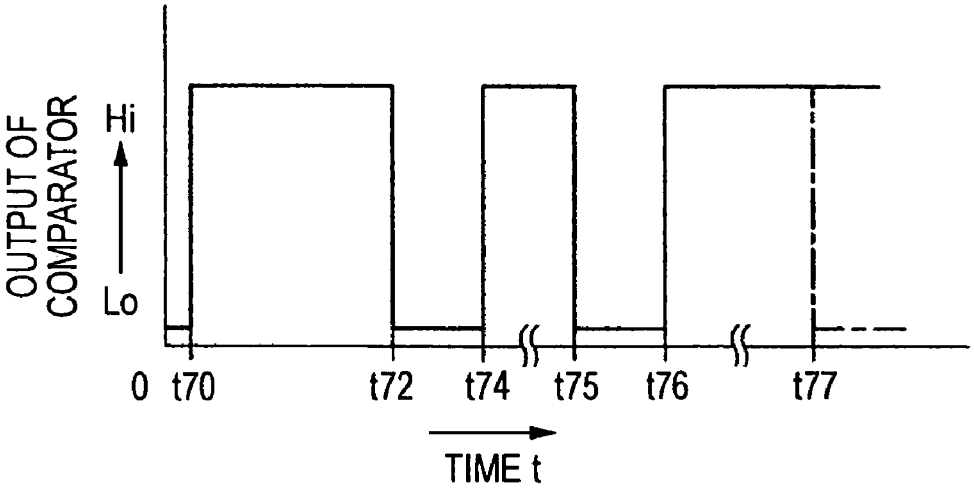
FIG. 28 is a graph showing output variation of the comparing and switching unit 12B with respect to an elapsed time.
Figure 29:
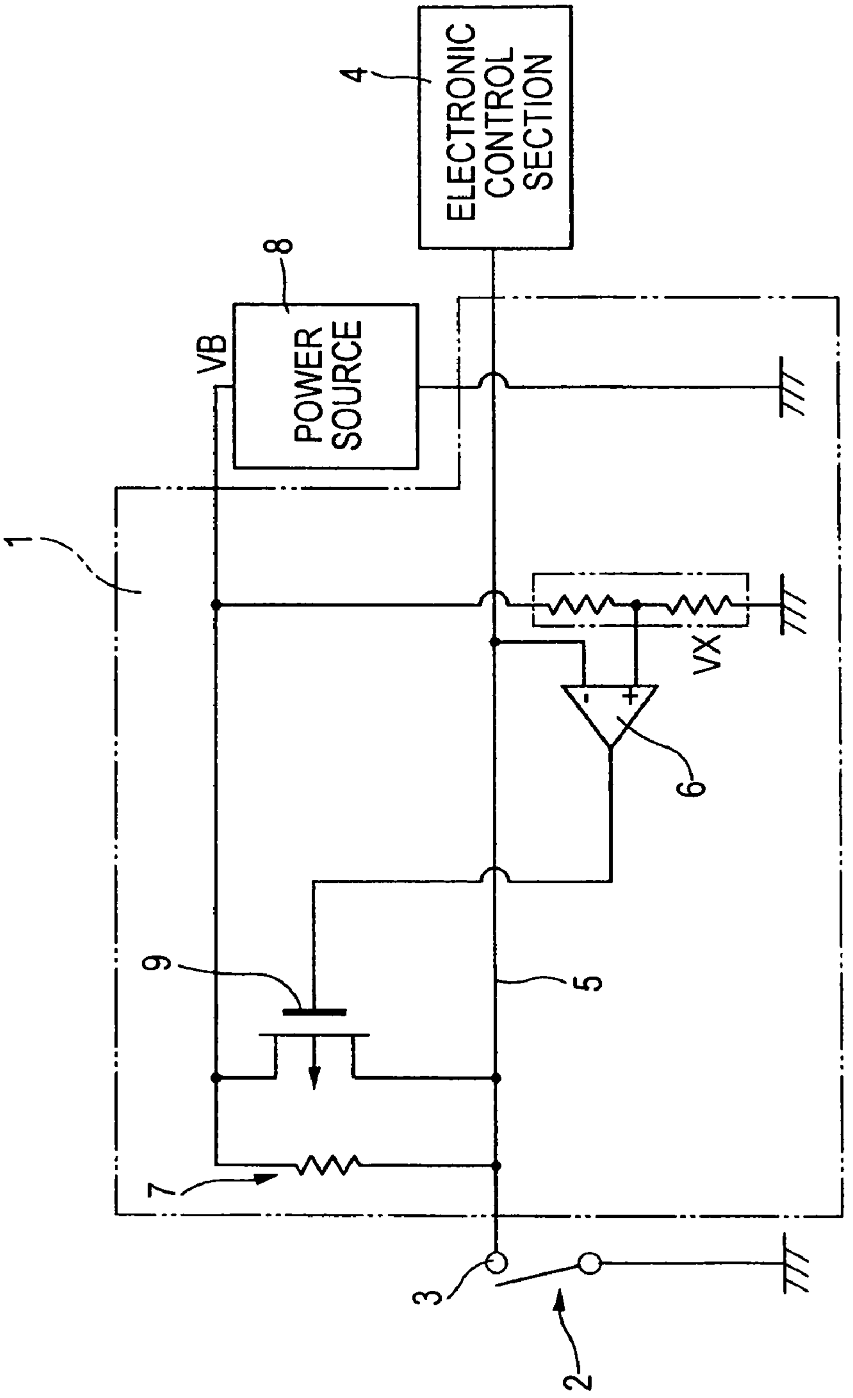
FIG. 29 PRIOR ART
FIG. 29 is a circuit diagram schematically showing the contact corrosion preventing apparatus 1 of US 2005/0231858A.
Figure 30:
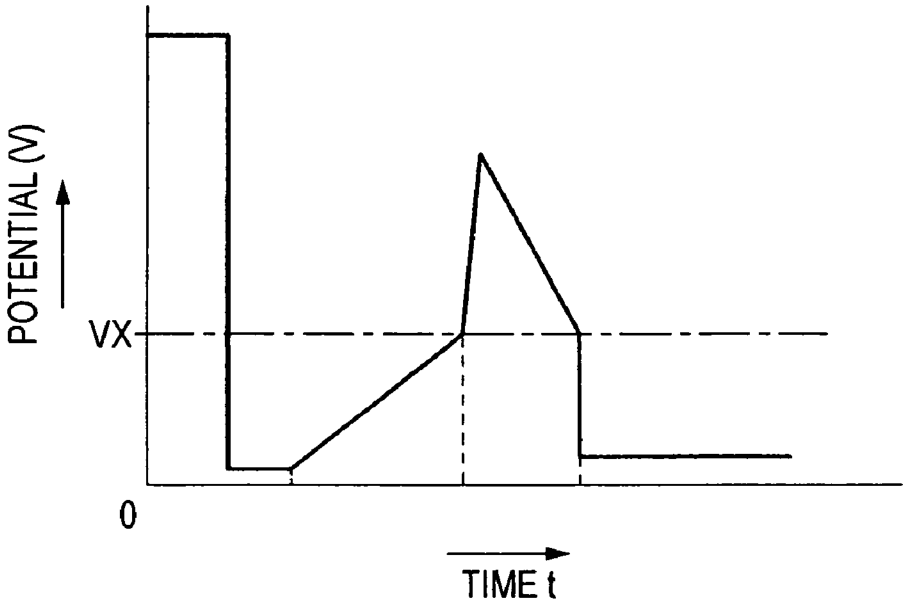
FIG. 30 PRIOR ART
FIG. 30 is a graph showing variation of the potential of the detection conducting path 5 with respect to an elapsed time.
Figure 31:
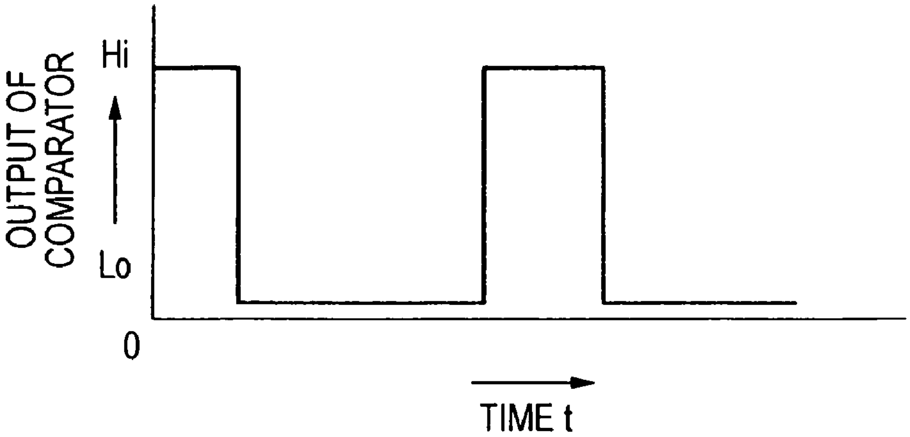
FIG. 31 PRIOR ART
FIG. 31 is a graph showing output variation of the comparator 6 with respect to an elapsed time.

FIG. 26 is a graph showing variation of the current of the detection conducting path 17 of the contact corrosion preventing apparatus 10G with respect to an elapsed time. FIG. 27 is a graph showing variation of a detection potential V7 with respect to an elapsed time. FIG. 28 is a graph showing output variation of the comparing and switching unit 12B with respect to an elapsed time. In FIG. 26, the ordinate indicates the current, and the abscissa indicates the time. In FIG. 27, the ordinate indicates the potential, and the abscissa indicates the time. In FIG. 28, the ordinate indicates the level of the output signal, and the abscissa indicates the time. Hereinafter, the operation of the thus configured contact corrosion preventing apparatus 10G will be described. In a state where the switch 13 is OFF, the detection potential V7 becomes the power source voltage VB (0≦t<t70). Since the detection potential V7 is higher than the corrosion restoration potential VM, the output signal becomes Lo. On the basis of the detection potential V7, the microcomputer 16G logically determines the connection state of the contact 14. When the switch 13 is switched to ON (t=t30), the contact 14 is grounded, and the detection potential V7 becomes the potential VA (t70≦t<t71). The detection potential V7 becomes lower than the corrosion restoration potential VM, and the output signal becomes Hi. When the output signal becomes Hi, the switching element 20 is set to the non-conduction state, and the connection detection current IB is passed through the detection conducting path 17 via the resistor 19. Therefore, the microcomputer 16C logically determines the connection state of the contact 14 based on the detection potential V7.

When corrosion of the contact 14 is started (t=t71), the increase of the resistance of the contact 14 which is due to corrosion of the contact 14 occurs, and the detection potential V7 is raised (t71≦t<t72). When the detection potential V7 is raised to be higher than the corrosion restoration potential VM (t=t72), the output signal becomes Lo, and the switching element 20 is set to the conduction state. This causes the corrosion prevention current IA to be passed through the detection conducting path 17, and the detection potential V7 is raised (t72≦t<t73). When the operation of removing corrosion of the contact 14 is started (t=t73), the detection potential V7 is lowered (t73≦t<t74).

When the corrosion prevention current IA is passed through the detection conducting path 17, the microcomputer 16G repeats the current-passing operation and the pause operation plural times until restoration of the contact 14 is detected by the comparing and switching unit 12B, and the pulse-like corrosion prevention current IA is passed through the detection conducting path 17 as shown in FIG. 28 (t74≦t<t75). In the case where restoration of the contact 14 is detected before the number of current-passing operations becomes larger than the stop number, the operation is the same as the contact corrosion preventing apparatus 10F of the seventh embodiment, and its description is omitted. Hereinafter, the case where restoration of the contact 14 is not detected until the number of current-passing operations becomes equal to or larger than the stop number will be described.

When the number of current-passing operations becomes equal to or larger than the stop number (t=76), the microcomputer 16G passes the corrosion prevention current IA, and then stops the voltage supply of the power source 15. At this time, the microcomputer 16G sets the ground switching element 30 to the conduction state to reduce the input impedance of the contact 14. The timing is not restricted to that after the passing of the corrosion prevention current IA, and the voltage supply of the power source 15 may be stopped before the passing of the corrosion prevention current.

Sometimes, corrosion of the contact 14 may be removed when it is left to stand for a constant time period after a constant amount of the corrosion prevention current IA is passed. For example, there is a case where corrosion is peeled and removed by repeating the operations of opening and closing the contact 14. In this case, when the voltage supply from the power source 15 is restarted (t=77), the output signal is maintained at Hi, the switching element 20 is set to the non-conduction state, and the connection detection current IB is passed through the detection conducting path 17 (the solid line in t77≦t). This causes the microcomputer 16G to logically determine the connection state of the contact 14 based on the detection potential V7. In the case of a failure of the contact 14 or the like, such as a contact failure of the switch 13, when the voltage supply from the power source 15 is restarted (t=77), the detection potential V7 does not become lower than the corrosion restoration potential VM, the output signal becomes Lo, and the switching element 20 is set to the conduction state. Therefore, the corrosion prevention current IA is again passed (t77≦t). The voltage supply of the power source is restarted, and it is possible to determine whether the potential rise is due to corrosion of the detection potential contact 14 or due to a failure of the switch 13.

According to the contact corrosion preventing apparatus 10G of the embodiment, when the variable impedance means 22 is switched to a low impedance, the corrosion prevention current IA is passed through the detection conducting path 17, and, when the variable impedance means 22 is switched to a high impedance, the connection detection current IB is passed through the detection conducting path 17. The comparing and switching unit 12B compares the detection potential V7 with the corrosion restoration potential VM, and, based on a result of the comparison, switches the variable impedance means 22. When the current passing time period becomes equal to or longer than the driving time period T1, the microcomputer 16G pauses the passing of the corrosion prevention current IA for the pause time period T2, and passes the connection detection current IB. Therefore, the passing of the corrosion prevention current IA is paused for the pause time period T2, whereby the corrosion prevention current IA can be suppressed from continuously flowing for a long term. Namely, excessive passing of the corrosion prevention current IA can be suppressed. Consequently, occurrences of an erroneous determination of the connection state of the contact 14 and a malfunction of the apparatus can be suppressed. Furthermore, since excessive passing of the corrosion prevention current IA can be suppressed, the lifetime of the contact corrosion preventing apparatus 10G can be prolonged.

According to the contact corrosion preventing apparatus 10G of the embodiment, corrosion of the contact 14 is removed by repetition of the current-passing operation and the pause operation. As compared with the case where the corrosion prevention current IA is continuously passed, therefore, the corrosion prevention current IA can be suppressed from being excessively passed through the detection conducting path 17.

According to the contact corrosion preventing apparatus 10G of the embodiment, the timer 31 counts the number of current-passing operations of passing the corrosion prevention current IA. When the number of current-passing operations becomes equal to or larger than the stop number, the microcomputer 16G stops the voltage supply of the power source 15, and stops the passing of the corrosion prevention current IA. Therefore, the corrosion prevention current IA can be suppressed from accumulating in the detection conducting path 17 and excessively passing by repetition of the current-passing operation and the pause operation. Consequently, occurrences of an erroneous determination of the connection state of the contact 14 of the contact corrosion preventing apparatus 10C and a malfunction of the apparatus can be further suppressed. Furthermore, since excessive passing of the corrosion prevention current IA can be suppressed, the lifetime of the contact corrosion preventing apparatus 10G can be further prolonged.

In the case of an erroneous determination of corrosion of the contact 14 due to a failure of the contact 14 or the like, in the contact corrosion preventing apparatus 10G of the conventional art, the corrosion prevention current IA continues to be excessively passed. In conjunction with a failure of the contact 14 or the like, such as a contact failure of the switch 13, therefore, the contact corrosion preventing apparatus 10G of the conventional art breaks down. In the contact corrosion preventing apparatus 10G of the embodiment, when the number of the current-passing operations becomes equal to or larger than the stop number, passing of the corrosion prevention current IA is stopped, and the contact corrosion preventing apparatus 10G can be prevented from breaking down in conjunction with a failure of the contact 14 or the like. When the voltage supply of the power source 15 is restarted, it is possible to determine whether this is caused by corrosion of the contact 14 or a failure of the contact 14 or the like.

The contact corrosion preventing apparatus 10G of the embodiment achieves the same effects as the contact corrosion preventing apparatus 10F of the seventh embodiment.

In the embodiment, the pause operation is performed on the basis of the current passing time period. The invention is not restricted to it. For example, the apparatus may be configured so that the microcomputers 16C, 16D can count the amount of the corrosion prevention current IA passed through the detection conducting path 17. Specifically, the counting of the current amount is realized by detecting the value of the corrosion prevention current IA, and integrating the current value over time. The microcomputers 16C, 16D have a function of, when the counted total current amount becomes equal to or larger than a pause current amount Q1, pausing the voltage supply of the power source 15. Therefore, the voltage supply of the power source 15 can be paused on the basis of the amount of the current passed through the detection conducting path 17. Consequently, the excessive corrosion prevention current IA can be suppressed from being passed through the detection conducting path 17. The microcomputers 16C, 16D may have a function of pausing the voltage supply of the power source 15 when at least one of conditions: (1) the current passing time period becomes equal to or longer than the driving time period T1; and (2) the counted total current amount becomes equal to or larger than the pause current amount Q1 is satisfied.

In the embodiment, the restoration threshold is the restoration potential VR. The invention is not restricted to it. For example, restoration of the contact 14 may be detected depending on whether the total current amount of the corrosion prevention current IA passed through the detection conducting path 17 is smaller than a restoration current amount QR or not. The restoration current amount QR is a current amount which is required for restoring the corroded contact 14. Specifically, the microcomputers 16C, 16D detect the value of the corrosion prevention current IA passed through the detection conducting path 17, and the current value is integrated over time, whereby the counting of the total current amount can be realized. The microcomputers 16C, 16D have a function of, when a current amount which is equal to or larger than the restoration current amount QR is detected, switching the switching element 20 to the non-conduction state. According to the configuration, even in the case of a threshold other than the restoration potential VR, detection of restoration of the contact 14 can be realized.

In the embodiment, the variable impedance means 22 is configured by including the resistor 19 and the switching element 20. The invention is not restricted to this configuration. The variable impedance means 22 may be a variable resistor. Specifically, the means can be realized by configuring so that the resistance of a variable resistor is switchable by using a relay or the like on the basis of the output signal of the comparing and switching unit 12.

In the embodiment, the source 30*b* of the ground switching element 30 is grounded. The invention is not restricted to this configuration. For example, the source 30*b* may be connected to a pull-up resistor, or any configuration may be employed as far as the input impedance of the contact is reduced.

What is claimed is:

1. An apparatus for preventing corrosion of a contact, the apparatus comprising:

a detection conducting path connected to the contact;

a variable impedance unit connected to the detection conducting path, the variable impedance unit being switchable between (i) a first impedance used for passing a corrosion prevention current into the detection conducting path and (ii) a second impedance through used for passing a current, which is used for detecting a connection state of the contact, into the detection conducting path, the first impedance being lower than the second impedance; and a comparing and switching unit that compares a detected value with a corrosion threshold, compares the detected value with a restoration threshold which is different from the corrosion threshold and switches the variable impedance unit based on comparing results, wherein:

the variable impedance unit comprises:

an impedance unit having a third impedance, the impedance unit connected to the detection conducting path; and a switching element connected to the detection conducting path in parallel to the impedance unit, the switching element being switchable between (i) a conduction state where terminals of the switching element are conducting and (ii) a non-conduction state where the terminals of the switching element are not conducting, the switching element having a fourth impedance, the third impedance being larger than the fourth impedance.

2. The apparatus according to claim 1, wherein:

the detection value is a potential of the detection conducting path, the corrosion threshold is a corrosion potential, the restoration threshold is a restoration potential, and the comparing and switching unit compares the potential of the detection conducting path with the corrosion potential, compares the potential of the detection conducting path with the restoration potential and switches the variable impedance unit based on the comparing results.

3. The apparatus according to claim 1, wherein the comparing and switching unit has a function of varying the restoration potential based on the potential of the detection conducting path.

4. The apparatus according to claim 1, wherein:

the contact comprises a contact of a switch, the impedance unit comprises a resistor, the switching element comprises a field effect transistor, and the comparing and switching unit comprises a comparator having a hysteresis.

5. An apparatus for preventing corrosion of a contact, the apparatus comprising:

a detection conducting path connected to the contact;

a variable impedance unit connected to the detection conducting path, the variable impedance unit being switchable between (i) a first impedance used for passing a corrosion prevention current into the detection conducting path and (ii) a second impedance through used for passing a current, which is used for detecting a connection state of the contact, into the detection conducting path, the first impedance being lower than the second impedance; and a comparing and switching unit that compares a detected value with a corrosion threshold, compares the detected value with a restoration threshold which is different from the corrosion threshold and switches the variable impedance unit based on comparing results, wherein:

the detected value comprises a potential of the detect conducting path and an amount of the current flowing through the detection conducting path, the corrosion threshold is a corrosion potential, the restoration threshold is a restoration current amount, the comparing and switching unit compares the potential of the detection conducting path with the corrosion potential, compares the amount of the current flowing through the detection conducting path with the restoration current amount and switches the variable impedance unit based on the comparing results.

6. An apparatus for preventing corrosion of a contact, the apparatus comprising:

a detection conducting path connected to the contact;

a variable impedance unit connected to the detection conducting path, the variable impedance unit being switchable between (i) a first impedance used for passing a corrosion prevention current into the detection conducting path and (ii) a second impedance through used for passing a current, which is used for detecting a connection state of the contact, into the detection conducting path, the first impedance being lower than the second impedance;

a comparing and switching unit that compares a detected value with a corrosion threshold, compares the detected value with a restoration threshold which is different from the corrosion threshold and switches the variable impedance unit based on comparing results; and a pause unit that pauses passing the corrosion prevention current for a predetermined pause time period if at least one of (i) a condition that a time period during which the corrosion prevention current flows into the detection conducting path is equal to or longer than a predetermined time period and (ii) a condition that an amount of the corrosion prevention current flowing into the detection conducting path is equal to or larger than a predetermined current amount, is satisfied.

7. The apparatus according to claim 6, further comprising:

a counting unit that counts at least one of (i) number of current-passing operations for passing the corrosion prevention current into the detection conducting path and (ii) number of pause operations in which the pause unit pauses passing the corrosion prevention current for the predetermined pause time period; and a stop unit that stops passing the corrosion prevention current when a counting result obtained by the counting unit is equal to or larger than a predetermined number.

8. The apparatus according to claim 7, further comprising:

an impedance lowering unit that lowers an input impedance of the contact at least one of (i) when the pause unit pauses passing the corrosion prevention current and (ii) when the stop unit stops passing the corrosion prevention current.

9. The apparatus according to claim 6, further comprising:

an impedance lowering unit that lowers an input impedance of the contact when the pause unit pauses passing the corrosion prevention current.

10. An apparatus for preventing corrosion of a contact, the apparatus comprising:

a detection conducting path connected to the contact;

a variable impedance unit connected to the detection conducting path, the variable impedance unit being switchable between (i) a first impedance used for passing a corrosion prevention current into the detection conducting path and (ii) a second impedance through used for passing a current, which is used for detecting a connection state of the contact, into the detection conducting path, the first impedance being lower than the second impedance;

a comparing and switching unit that compares a detected value with a corrosion/restoration threshold and switches the variable impedance unit based on a comparing result; and a pause unit that pauses passing the corrosion prevention current for a predetermined pause time period if at least one of (i) a condition that a time period during which the corrosion prevention current flows into the detection conducting path is equal to or longer than a predetermined time period and (ii) a condition that an amount of the corrosion prevention current flowing into the detection conducting path is equal to or larger than a predetermined current amount, is satisfied.

11. The apparatus according to claim 10, further comprising:

a counting unit that counts at least one of (i) number of current-passing operations for passing the corrosion prevention current into the detection conducting path and (ii) number of pause operations in which the pause unit pauses passing the corrosion prevention current for the predetermined pause time period; and a stop unit that stops passing the corrosion prevention current when a counting result obtained by the counting unit is equal to or larger than a predetermined number.

12. The apparatus according to claim 11, further comprising:

an impedance lowering unit that lowers an input impedance of the contact at least one of (i) when the pause unit pauses passing the corrosion prevention current and (ii) when the stop unit stops passing the corrosion prevention current.

13. The apparatus according to claim 10, further comprising:

an impedance lowering unit that lowers an input impedance of the contact when the pause unit pauses passing the corrosion prevention current.

* * * * *